(12) United States Patent
Yamazaki et al.

(10) Patent No.: US 11,495,690 B2
(45) Date of Patent: Nov. 8, 2022

(54) SEMICONDUCTOR DEVICE AND FABRICATION METHOD OF SEMICONDUCTOR DEVICE

(71) Applicant: Semiconductor Energy Laboratory Co., Ltd., Atsugi (JP)

(72) Inventors: Shunpei Yamazaki, Setagaya (JP); Katsuaki Tochibayashi, Isehara (JP); Ryota Hodo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 112 days.

(21) Appl. No.: 16/969,259

(22) PCT Filed: Feb. 14, 2019

(86) PCT No.: PCT/IB2019/051176
§ 371 (c)(1),
(2) Date: Aug. 12, 2020

(87) PCT Pub. No.: WO2019/162807
PCT Pub. Date: Aug. 29, 2019

(65) Prior Publication Data
US 2021/0005751 A1    Jan. 7, 2021

(30) Foreign Application Priority Data

Feb. 23, 2018  (JP) .............................. JP2018-030400
Mar. 6, 2018   (JP) .............................. JP2018-040081
Jul. 31, 2018  (JP) .............................. JP2018-143451

(51) Int. Cl.
*H01L 29/786* (2006.01)

(52) U.S. Cl.
CPC .... *H01L 29/7869* (2013.01); *H01L 29/78651* (2013.01)

(58) Field of Classification Search
CPC combination set(s) only.
See application file for complete search history.

(56) References Cited

U.S. PATENT DOCUMENTS 6,333,229 B1   12/2001  Furukawa et al.
6,673,683 B1   1/2004   Sheu et al.
(Continued)

FOREIGN PATENT DOCUMENTS

CN      104769150 A      7/2015
DE      112013007567     11/2018
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

(Continued)

*Primary Examiner* — Julio J Maldonado
*Assistant Examiner* — Mohammad A Rahman
(74) *Attorney, Agent, or Firm* — Robinson Intellectual Property Law Office; Eric J. Robinson

(57) ABSTRACT

A semiconductor device having high on-state current and high reliability is provided. The semiconductor device includes, a first insulator; a first oxide over the first insulator; a second oxide over the first oxide; a first conductor and a second conductor over the second oxide; a third oxide over the second oxide; a second insulator over the third oxide; a third conductor located over the second insulator and overlapping with the third oxide; a third insulator in contact with a top surface of the first insulator, a side surface of the first oxide, a side surface of the second oxide, a side surface of the first conductor, a top surface of the first conductor, a side surface of the second conductor, and a top surface of the (Continued)

second conductor; a fourth insulator over the third insulator; a fifth insulator over the fourth insulator; and a sixth insulator over the third conductor, the second insulator, the third oxide and the fifth insulator. The sixth insulator is in contact with a top surface of each of the third conductor, the second insulator, the third oxide, and the fifth insulator.

7 Claims, 24 Drawing Sheets

(56) References Cited

U.S. PATENT DOCUMENTS

| | | | |
|---|---|---|---|
| 6,841,831 | B2 | 1/2005 | Hanafi et al. |
| 6,958,500 | B2 | 10/2005 | Saito |
| 8,547,771 | B2 | 10/2013 | Koyama |
| 8,809,854 | B2 | 8/2014 | Isobe et al. |
| 9,660,100 | B2 | 5/2017 | Okazaki |
| 9,768,318 | B2 | 9/2017 | Yamazaki et al. |
| 9,831,274 | B2 | 11/2017 | Takahashi et al. |
| 9,871,058 | B2 | 1/2018 | Takahashi et al. |
| 9,881,939 | B2 | 1/2018 | Takahashi et al. |
| 9,905,657 | B2 | 2/2018 | Endo et al. |
| 9,954,003 | B2 | 4/2018 | Matsuda et al. |
| 10,019,025 | B2 | 7/2018 | Yamazaki |
| 10,037,294 | B2 | 7/2018 | Onuki et al. |
| 10,050,152 | B2 | 8/2018 | Yamazaki |
| 10,147,681 | B2 | 12/2018 | Yamazaki et al. |
| 10,181,531 | B2 | 1/2019 | Sasagawa et al. |
| 10,186,614 | B2 | 1/2019 | Asami |
| 10,210,915 | B2 | 2/2019 | Onuki |
| 10,256,348 | B2 | 4/2019 | Endo et al. |
| 10,461,099 | B2 | 10/2019 | Takahashi et al. |
| 10,522,688 | B2 | 12/2019 | Kato et al. |
| 2012/0223304 | A1 | 9/2012 | Yoneda |
| 2013/0334533 | A1 | 12/2013 | Yamazaki |
| 2014/0124776 | A1 | 5/2014 | Takahashi et al. |
| 2016/0233339 | A1 | 8/2016 | Okazaki |
| 2016/0284859 | A1 | 9/2016 | Asami |
| 2016/0372606 | A1* | 12/2016 | Ito ................. H01L 29/78696 |
| 2017/0033109 | A1 | 2/2017 | Yamazaki |
| 2017/0062192 | A1 | 3/2017 | Oota et al. |
| 2017/0110453 | A1 | 4/2017 | Ikeda |
| 2017/0179293 | A1 | 6/2017 | Yamazaki |
| 2017/0179294 | A1 | 6/2017 | Kato et al. |
| 2017/0207347 | A1 | 7/2017 | Endo et al. |
| 2017/0236842 | A1 | 8/2017 | Matsuda et al. |
| 2017/0337149 | A1 | 11/2017 | Onuki et al. |
| 2017/0358334 | A1 | 12/2017 | Onuki |
| 2018/0019343 | A1 | 1/2018 | Asami |
| 2018/0040641 | A1* | 2/2018 | Yamazaki ........... H01L 29/7869 |
| 2018/0323220 | A1 | 11/2018 | Takahashi et al. |

FOREIGN PATENT DOCUMENTS

| | | |
|---|---|---|
| JP | 2015-149506 A | 8/2015 |
| JP | 2017-118106 A | 6/2017 |
| JP | 2017-212022 A | 11/2017 |
| JP | 2017-224377 A | 12/2017 |
| KR | 2015-0082299 A | 7/2015 |
| TW | 201430920 | 8/2014 |
| TW | 201810540 | 3/2018 |
| WO | WO-2014/073585 | 5/2014 |

OTHER PUBLICATIONS

Yamazaki.S et al., "Properties of crystalline In—Ga—Zn— oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn— Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn— Oxide TFTs Based on Variable Frame Frequency", SID Digest '10 : SID International Symposium Digest of Technical Papers, May 23, 2010, vol. 41, No. 1, pp. 626-629.

International Search Report (Application No. PCT/IB2019/051176) dated May 21, 2019.

Written Opinion (Application No. PCT/IB2019/051176) dated May 21, 2019.

* cited by examiner

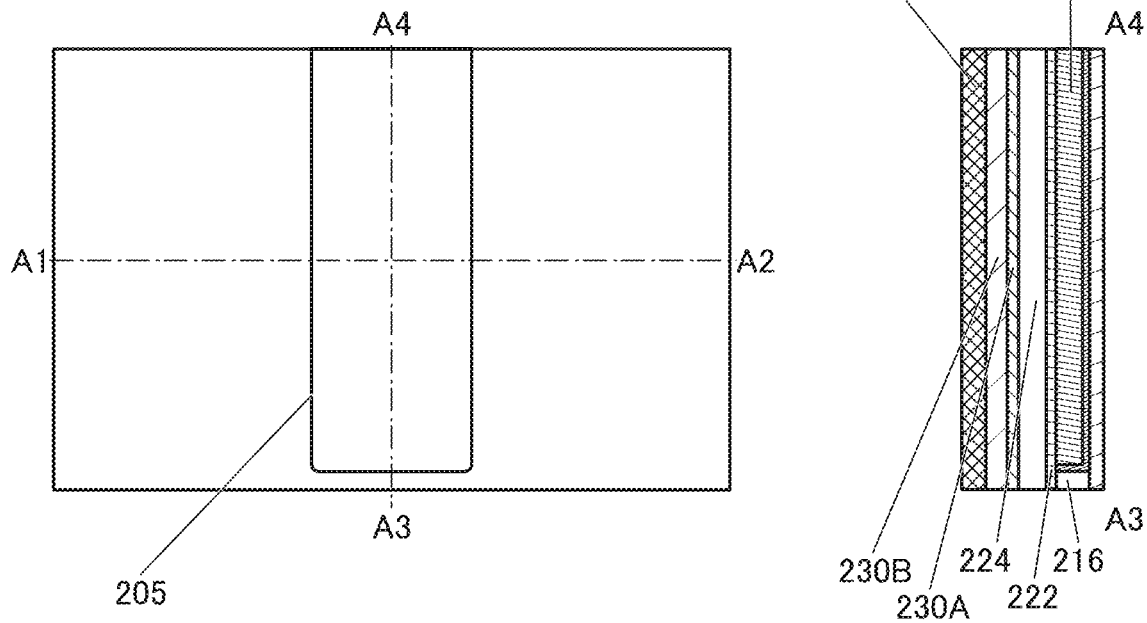
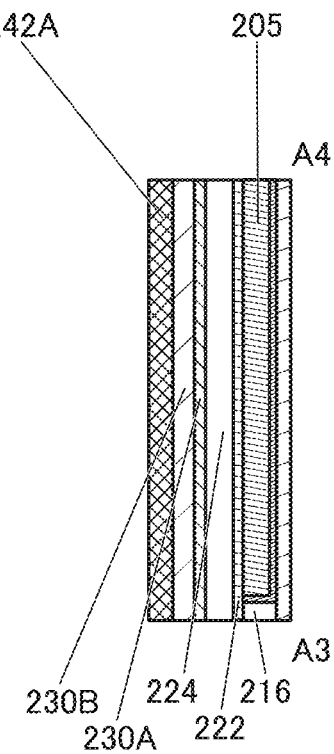
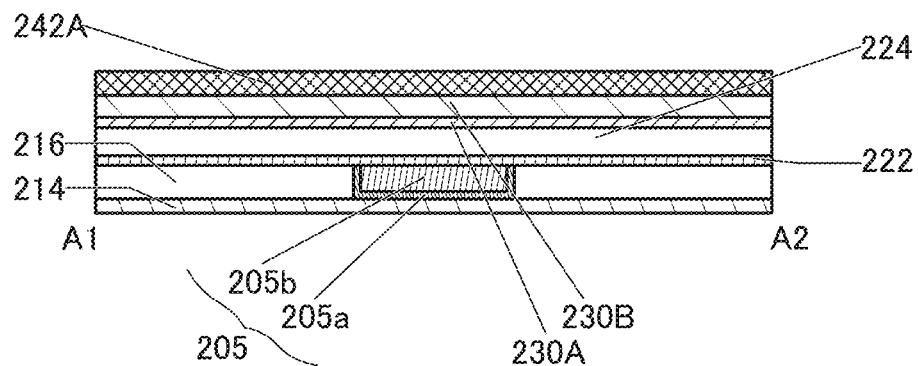

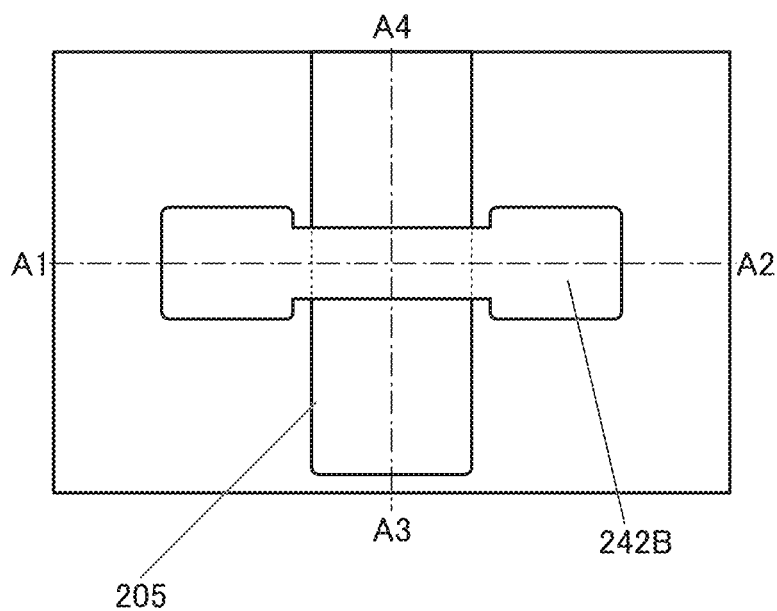
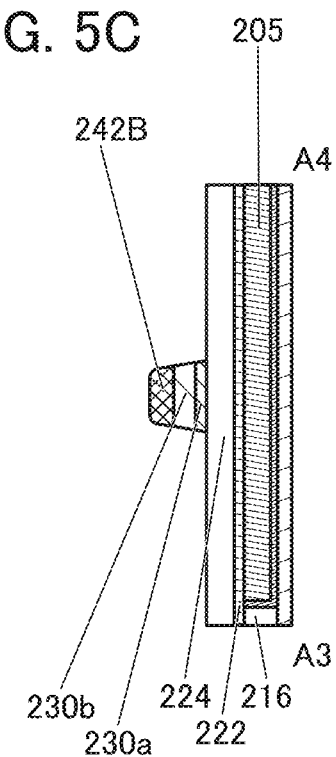
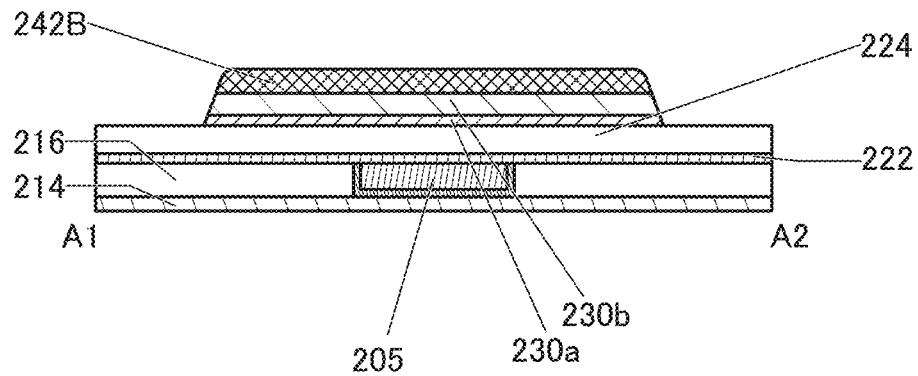

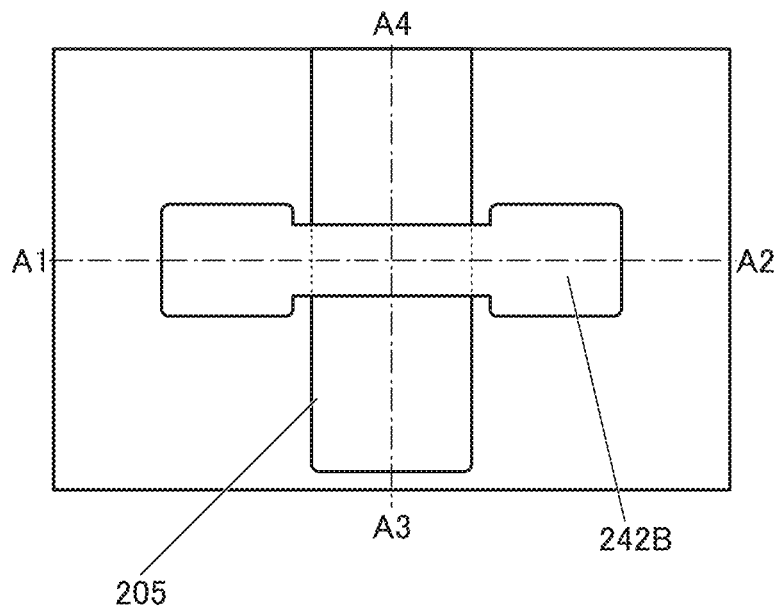
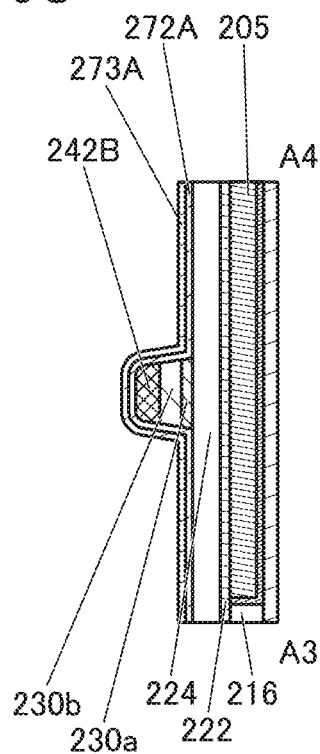
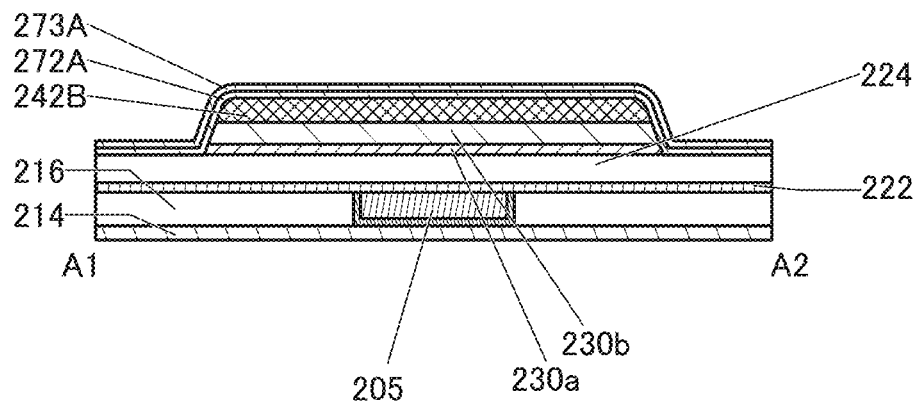

FIG. 7C
FIG. 7A
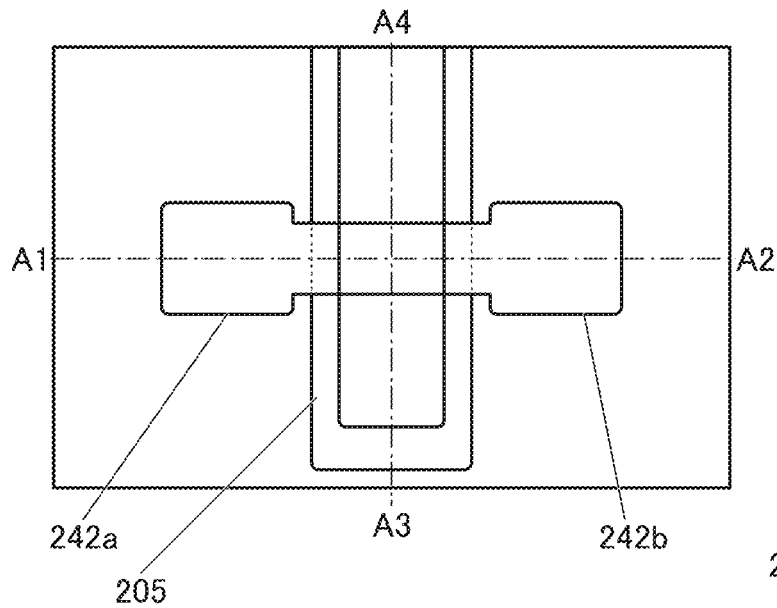
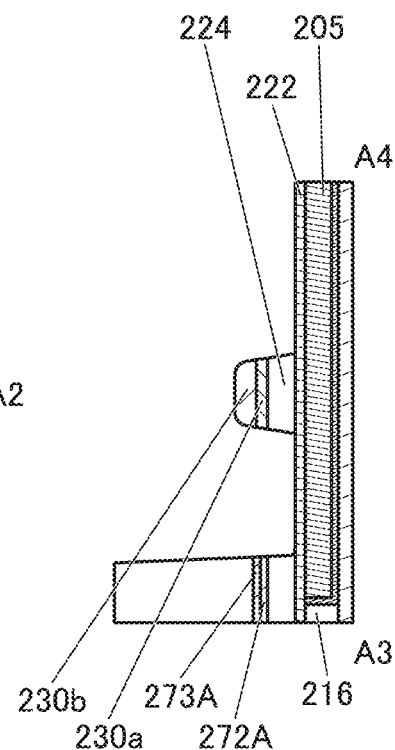
FIG. 7B
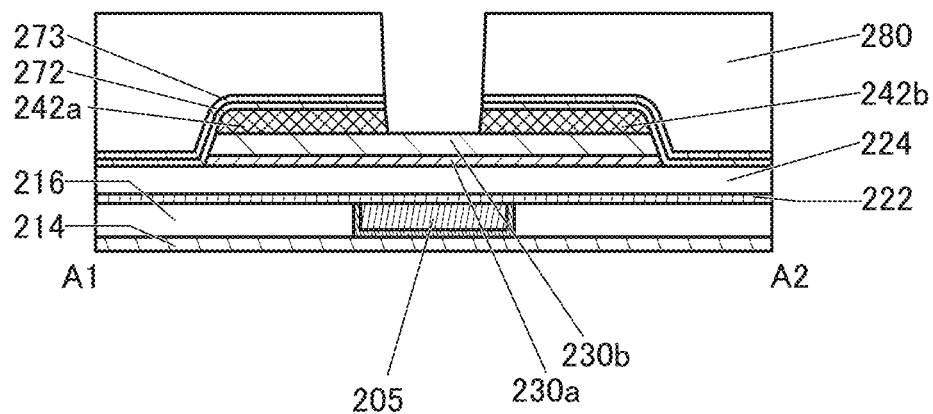

FIG. 8C
FIG. 8A
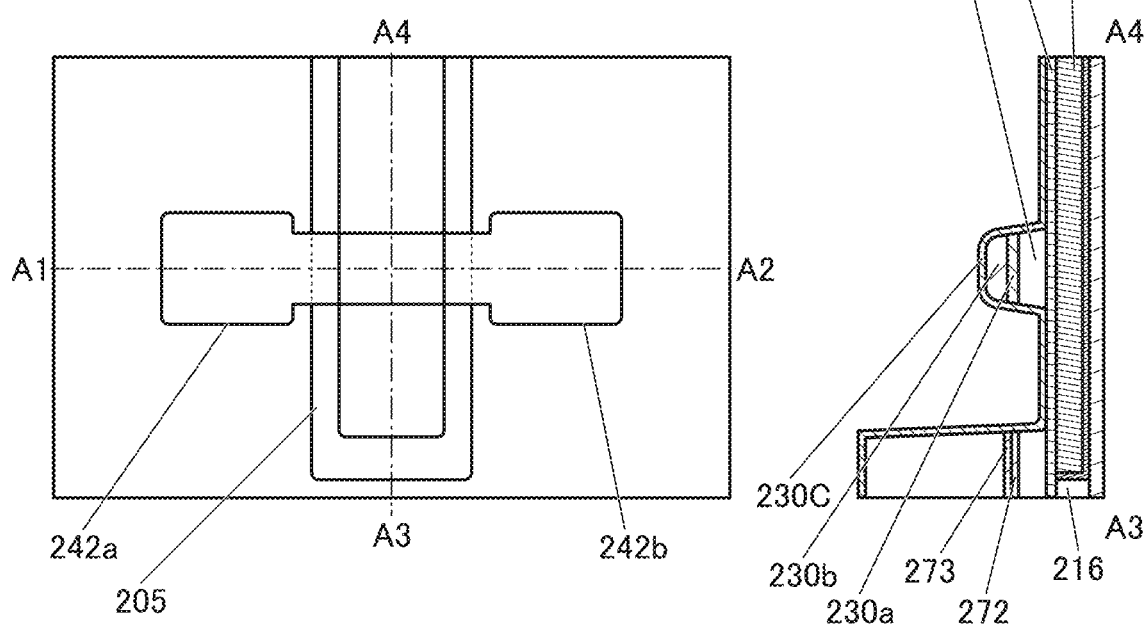
FIG. 8B
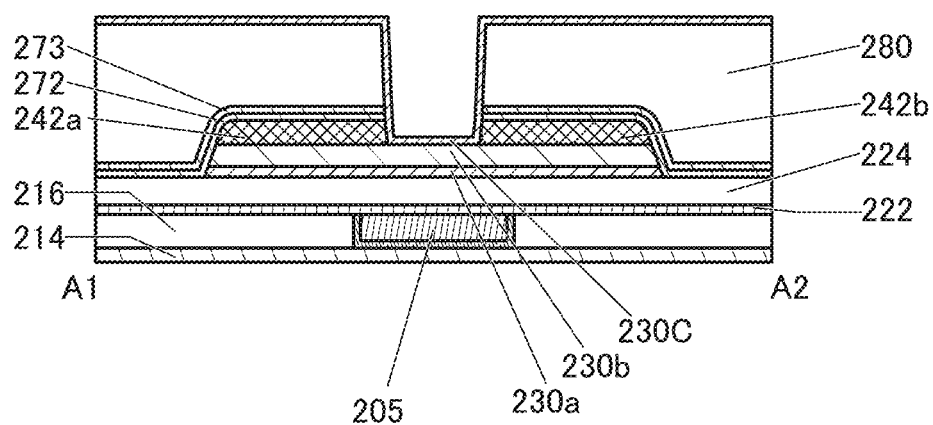

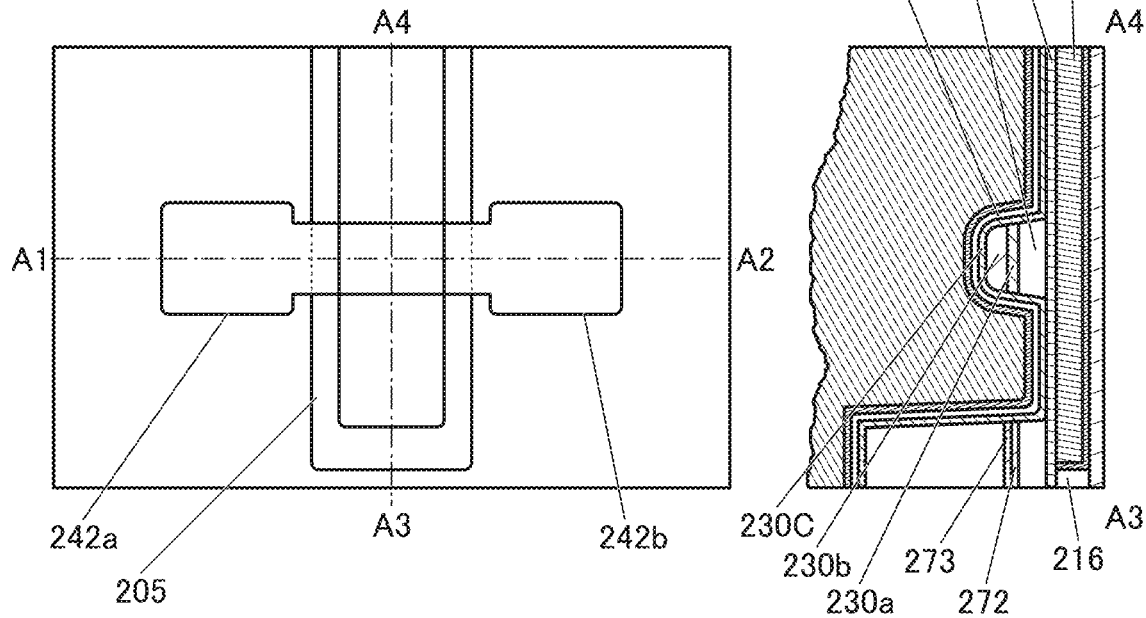
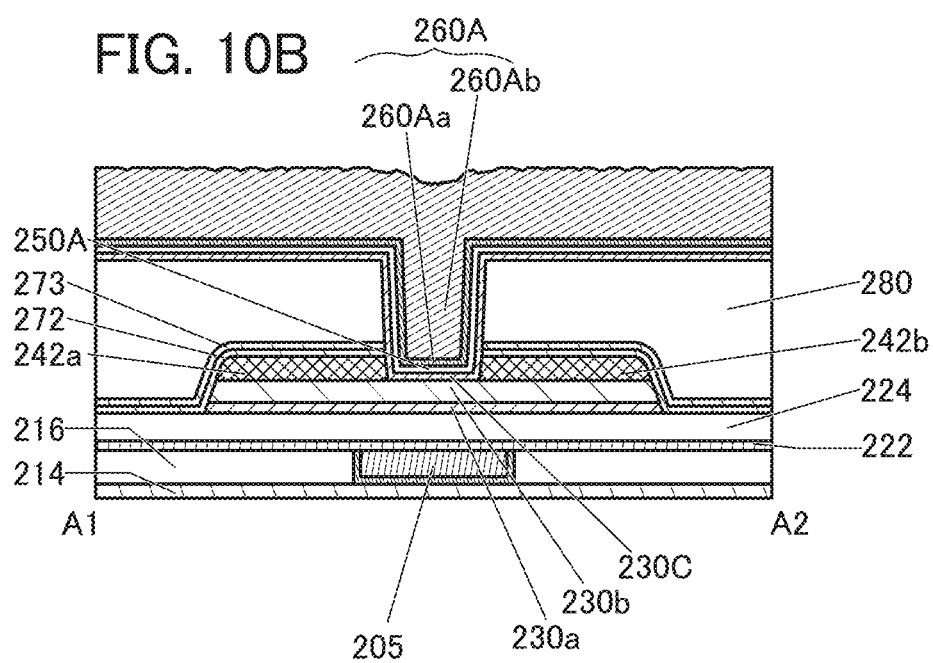

FIG. 18A
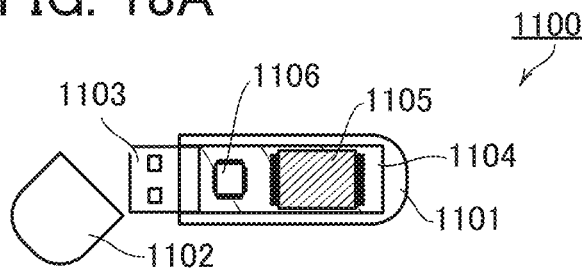
FIG. 18B  FIG. 18C
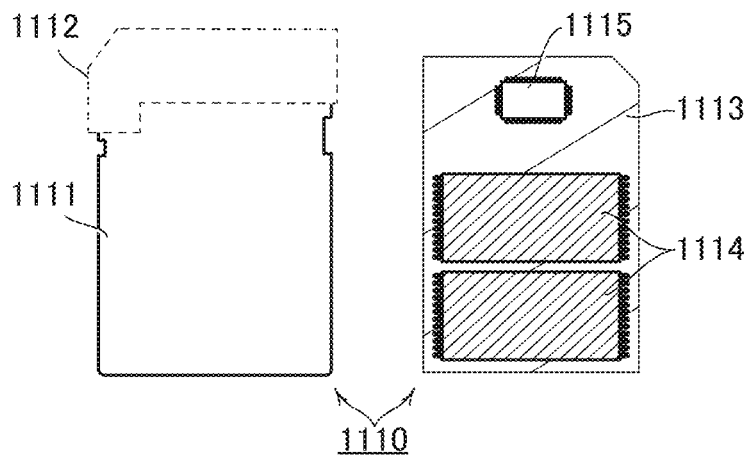
FIG. 18D
FIG. 18E
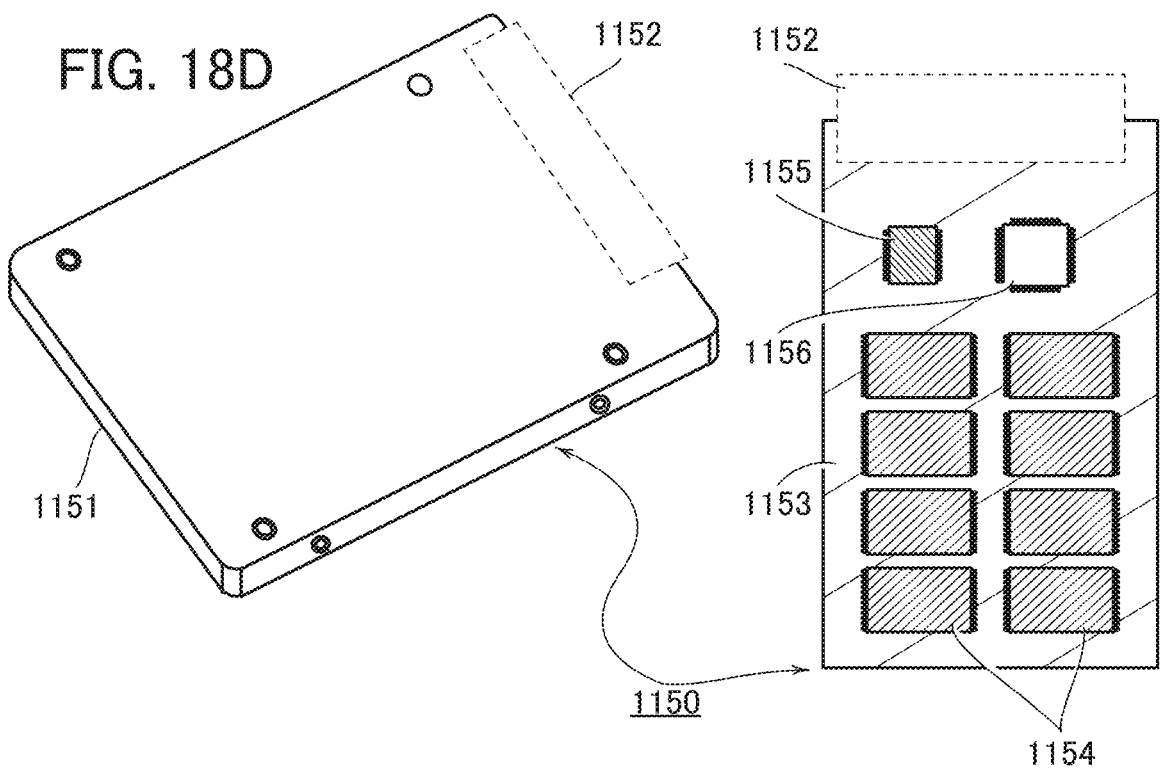

FIG. 19A
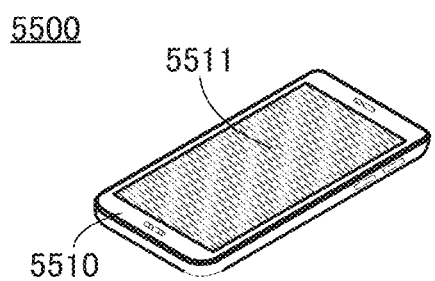
FIG. 19B
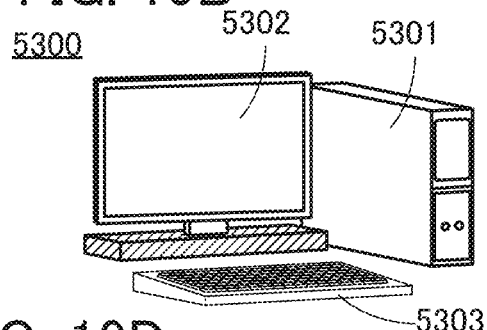
FIG. 19C
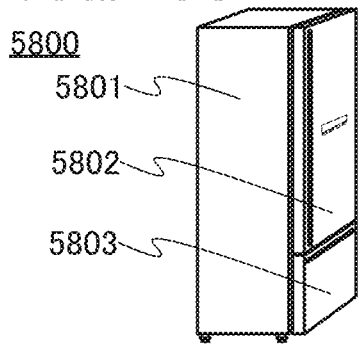
FIG. 19D
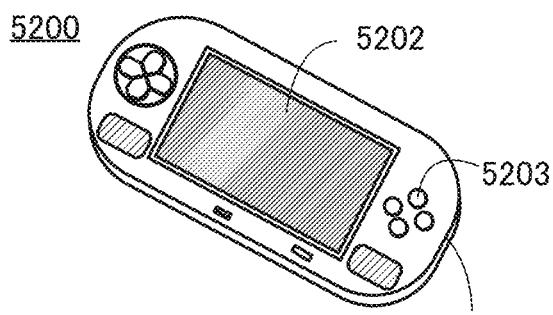
FIG. 19E1
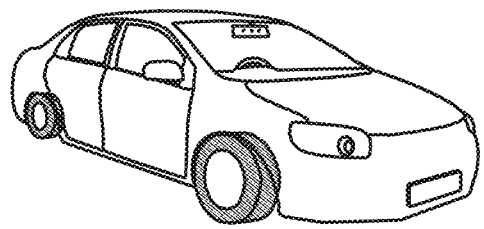
FIG. 19E2
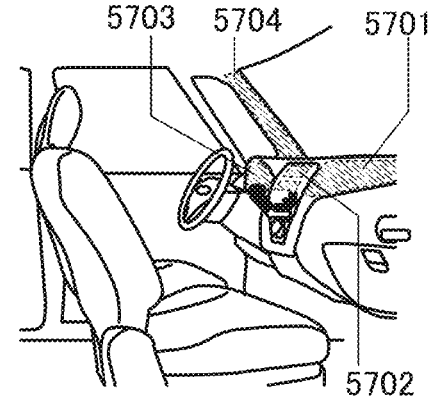
FIG. 19F
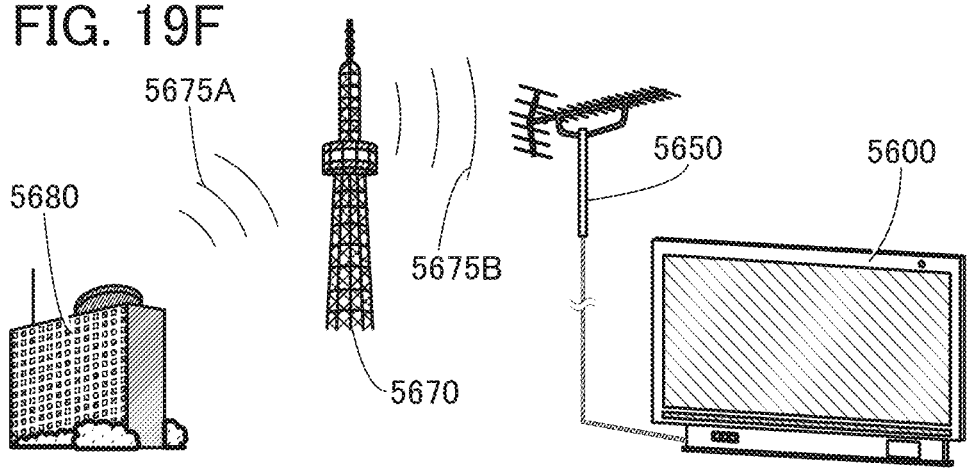

SEMICONDUCTOR DEVICE AND FABRICATION METHOD OF SEMICONDUCTOR DEVICE

TECHNICAL FIELD

One embodiment of the present invention relates to a semiconductor device and a method for fabricating the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

A silicon-based semiconductor material is widely known as a material of a semiconductor thin film that can be used in a transistor, and as another material, an oxide semiconductor has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Documents 1 to 3). In Non-Patent Documents 1 and 2, a technique for forming a transistor using an oxide semiconductor having the CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD '13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Another object of one embodiment of the present invention is to provide a semiconductor device with high frequency characteristics. Alternatively, an object of one embodiment of the present invention is to provide a semiconductor device having favorable reliability. Another object of one embodiment of the present invention is to provide a semiconductor device that can be miniaturized or highly integrated. Another object of one embodiment of the present invention is to provide a semiconductor device with favorable electrical characteristics. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed information writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the descriptions of these objects do not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a semiconductor device including, a first insulator; a first oxide over the first insulator; a second oxide over the first oxide; a first conductor and a second conductor over the second oxide; a third oxide over the second oxide; a second insulator over the third oxide; a third conductor located over the second insulator and overlapping with the third oxide; a third insulator in contact with a top surface of the first insulator, a side surface of the first oxide, a side surface of the second oxide, a side surface of the first conductor, a top surface of the first conductor, a side surface of the second conductor, and a top surface of the second conductor; a fourth insulator over the third insulator; a fifth insulator over the fourth insulator; and a sixth insulator over the third conductor, the second insulator, the third oxide and the fifth insulator. The sixth insulator is in contact with a top surface of each of the third conductor, the second insulator, the third oxide, and the fifth insulator.

Preferably, the third insulator and the fourth insulator are each less likely to transmit one or both of oxygen and hydrogen than the first insulator.

Preferably, the third insulator, the fourth insulator, and the sixth insulator are each less likely to transmit one or both of oxygen and hydrogen than the second insulator.

Preferably, the fourth insulator and the sixth insulator are each an oxide comprising one or both of aluminum and hafnium.

Preferably, the fourth insulator and the sixth insulator are each aluminum oxide.

Preferably, the third insulator includes silicon and nitrogen.

Preferably, the first oxide to the third oxide each include In, an element M (M is Al, Ga, Y, or Sn), and Zn.

Effect of the Invention

According to one embodiment of the present invention, a semiconductor device having a high on-state current can be provided. Alternatively, according to one embodiment of the present invention, it is possible to provide a semiconductor device with high frequency characteristics. Alternatively, according to one embodiment of the present invention, it is possible to provide a highly reliable semiconductor device. Alternatively, according to one embodiment of the present invention, it is possible to provide a semiconductor device that can be miniaturized or highly integrated. Alternatively, according to one embodiment of the present invention, it is possible to provide a semiconductor device with favorable electrical characteristics. Alternatively, according to one embodiment of the present invention, it is possible to provide a semiconductor device with high productivity.

Alternatively, it is possible to provide a semiconductor device capable of retaining data for a long time. Alternatively, it is possible to provide a semiconductor device capable of high-speed data writing. Alternatively, it is possible to provide a semiconductor device with high design flexibility. Alternatively, it is possible to provide a semiconductor device capable of reducing power consumption. Alternatively, it is possible to provide a novel semiconductor device.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIGS. 4A-4C A top view and cross-sectional views illustrating a fabrication method of a semiconductor device of one embodiment of the present invention.

FIGS. 5A-5C A top view and cross-sectional views illustrating a fabrication method of a semiconductor device of one embodiment of the present invention.

FIGS. 6A-6C A top view and cross-sectional views illustrating a fabrication method of a semiconductor device of one embodiment of the present invention.

FIGS. 7A-7C A top view and cross-sectional views illustrating a fabrication method of a semiconductor device of one embodiment of the present invention.

FIGS. 8A-8C A top view and cross-sectional views illustrating a fabrication method of a semiconductor device of one embodiment of the present invention.

FIGS. 10A-10C A top view and cross-sectional views illustrating a fabrication method of a semiconductor device of one embodiment of the present invention.

FIGS. 18A-18E Schematic views of memory devices of one embodiment of the present invention.

FIGS. 19A-19F Diagrams illustrating electronic devices of one embodiment of the present invention.

MODE FOR CARRYING OUT THE INVENTION

Figure 1A:
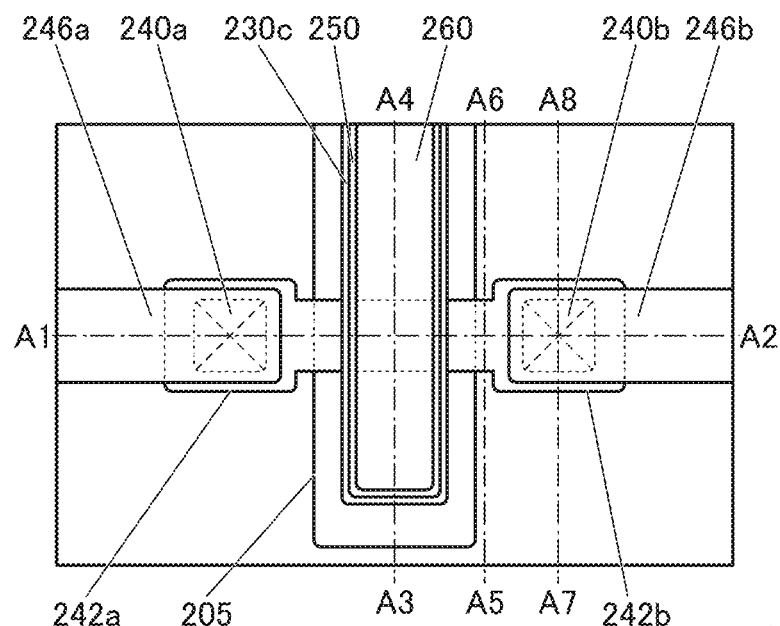
FIGS. 1A-1C A top view and cross-sectional views of a semiconductor device according to one embodiment of the present invention.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relationship between components with reference to drawings. The positional relation between components is changed as appropriate in accordance with a direction in which the components are described. Thus, terms for the description are not limited to those used in this specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on transistor structures, channel width in a region where a channel is actually formed (hereinafter also referred to as effective channel width) is different from channel width shown in a top view of a transistor (hereinafter also referred to as apparent channel width) in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies (also referred to as $V_O$) are formed by mixing of impurities in some cases, for example. Furthermore, when the semiconductor is silicon, examples of the impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Silicon nitride oxide is a material that contains more nitrogen than oxygen in its composition.

In addition, in this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In addition, in this specification and the like, "parallel" indicates a state where two straight lines are placed at an angle greater than or equal to −10° and less than or equal to 10°. Accordingly, the case where the angle is greater than or equal to −5° and less than or equal to 5° is also included. The term "substantially parallel" indicates a state where two straight lines are placed such that the angle formed therebetween is greater than or equal to −30° and less than or equal to 30°. In addition, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed such that the angle formed therebetween is greater than or equal to 60° and less than or equal to 120°.

Note that in this specification, a barrier film means a film having a function of inhibiting transmission of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, the OS FET or the OS transistor can also be referred to as a transistor including an oxide or an oxide semiconductor.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including the transistor 200 of one embodiment of the present invention is described below.

<Structure Example of Semiconductor Device>

Figure 1C:
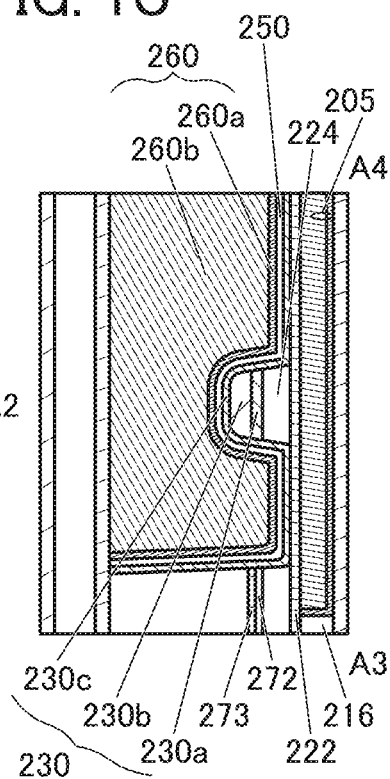
Figure 1B:
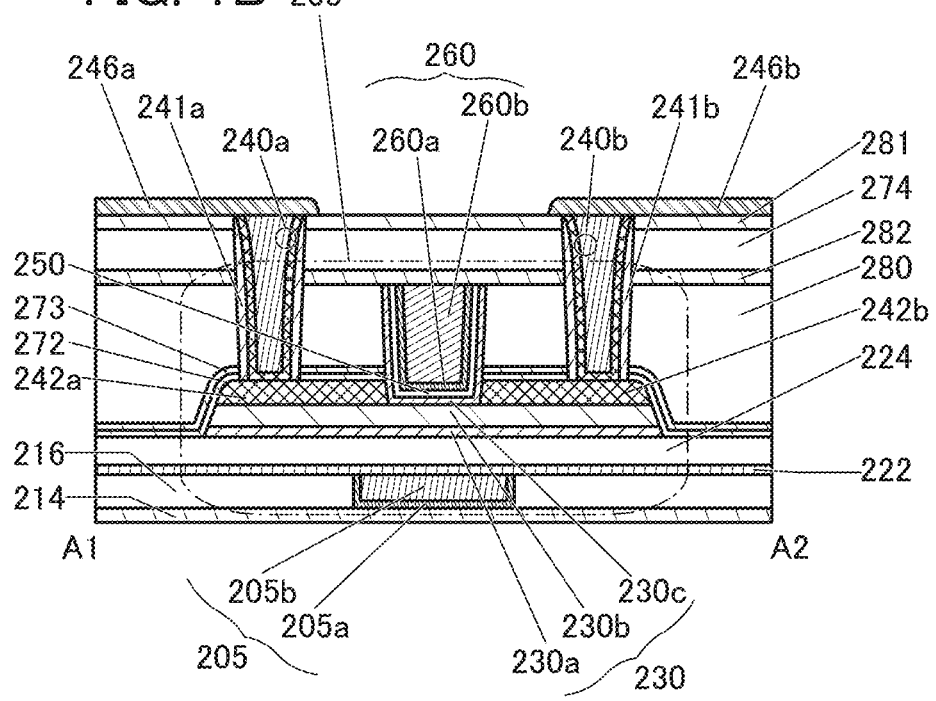

FIG. 1(A), FIG. 1(B), and FIG. 1(C) are a top view and cross-sectional views of a transistor 200 according to one embodiment of the present invention and the periphery of the transistor 200.

FIG. 1(A) is a top view of a semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A).

The semiconductor device of one embodiment of the present invention includes an insulator 214 over a substrate (not illustrated), the transistor 200 over the insulator 214, an insulator 280 over the transistor 200, an insulator 282 over the insulator 280, an insulator 274 over the insulator 282, and an insulator 281 over the insulator 274. The insulator 214, insulator 280, insulator 282, the insulator 274, and the insulator 281 function as interlayer films. A conductor 240 (a conductor 240a and a conductor 240b) that functions as a plug and is electrically connected to the transistor 200 is also included. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 281 and the conductor 240.

The insulator 241a is provided in contact with the inner wall of an opening in an insulator 272, an insulator 273, the insulator 280, insulator 282, the insulator 274, and the insulator 281, a first conductor of the conductor 240a is provided in contact with the side surface of the insulator 241a, and a second conductor of the conductor 240a is provided on the inner side thereof. The insulator 241b is provided in contact with the inner wall of an opening in the insulator 272, the insulator 273, the insulator 280, the insulator 282, the insulator 274, and the insulator 281, a first conductor of the conductor 240b is provided in contact with the side surface of the insulator 241b, and a second conductor of the conductor 240b is provided on the inner side thereof. Here, a top surface of the conductor 240 and a top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

[Transistor 200]

As illustrated in FIG. 1, the transistor 200 includes an insulator 216 over the insulator 214; a conductor 205 (a conductor 205a and a conductor 205b) positioned so as to be embedded in the insulator 216; an insulator 222 over the insulator 216 and the conductor 205; an insulator 224 over the insulator 222; an oxide 230a over the insulator 224; an oxide 230b over the oxide 230a; a conductor 242a and a conductor 242b over the oxide 230b; an oxide 230c over the oxide 230b; an insulator 250 over the oxide 230c; a conductor 260 (a conductor 260a and a conductor 260b) positioned over the insulator 250 and overlapping with the oxide 230c; the insulator 272 in contact with part of a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b; the insulator 273 over the insulator 272; the insulator 280 over the insulator 273; and the insulator 282 over the insulator 280. The oxide 230c is in contact with a side surface of the insulator 272 and a side surface of the insulator 273. The conductor 260 includes the conductor 260a and the conductor 260b, and the conductor 260a is positioned so as to cover a bottom surface and a side surface of the conductor 260b. Here, as illustrated in FIG. 1(B), a top surface of the conductor 260 is positioned to be substantially aligned with a top surface of the insulator 250 and a top surface of the oxide 230c. The insulator 282 is in contact with a top surface of each of the conductor 260, the oxide 230c, the insulator 250, and the insulator 280.

It is preferable that the insulator 222, the insulator 272, the insulator 273, and the insulator 282 have a function of inhibiting diffusion of hydrogen (e.g., at least one of a hydrogen atom, a hydrogen molecule, and the like). In addition, it is preferable that the insulator 222, the insulator 272, the insulator 273, and the insulator 282 have a function of inhibiting diffusion of oxygen (e.g., at least one of an oxygen atom, an oxygen molecule, and the like). For example, preferably, the insulator 222, the insulator 272, the insulator 273, and the insulator 282 each have a lower permeability of one or both of oxygen and hydrogen than the insulator 224. Preferably, the insulator 222, the insulator 272, the insulator 273, and the insulator 282 each have a lower permeability of one or both of oxygen and hydrogen than the insulator 250. Preferably, the insulator 222, the insulator 272, the insulator 273, and the insulator 282 each have a lower permeability of one or both of oxygen and hydrogen than the insulator 280.

As illustrated in FIGS. 1(B) and 1(C), the insulator 272 is preferably in contact with the top and side surfaces of the conductor 242a, the top and side surfaces of the conductor 242b, the side surfaces of the oxide 230a and the oxide 230b, and the top surface of the insulator 224. The insulator 273 is preferably provided over and in contact with the insulator 272. Thus, the insulator 280 is isolated from the insulator 224, the oxide 230a, and the oxide 230b by the insulator 272 and the insulator 273.

The oxide 230 preferably includes the oxide 230a placed over the insulator 224, the oxide 230b placed over the oxide 230a, and the oxide 230c which is placed over the oxide 230b and at least partly in contact with a top surface of the oxide 230b.

The transistor 200 has, in the region where a channel is formed (hereinafter also referred to as a channel formation region) and its vicinity, a structure in which three layers of the oxide 230a, the oxide 230b, and the oxide 230c are stacked; however, the present invention is not limited thereto. For example, a single layer of the oxide 230b, a two-layer structure of the oxide 230b and the oxide 230a, a two-layer structure of the oxide 230b and the oxide 230c, or a stacked-layer structure of four or more layers may be provided. Although the conductor 260 is shown to have a stacked-layer structure of two layers in the transistor 200, the present invention is not limited thereto. For example, the conductor 260 may have a single-layer structure or a stacked-layer structure of three or more layers.

Here, the conductor 260 functions as a gate electrode of the transistor, and the conductor 242a and the conductor 242b function as a source electrode and a drain electrode. In the transistor 200, the conductor 260 functioning as a gate electrode is formed in a self-aligned manner to fill an opening formed by the insulator 280 and the like. The formation of the conductor 260 in this manner allows the conductor 260 to be positioned certainly in the region between the conductor 242a and the conductor 242b without alignment.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in a channel formation region has an extremely low leakage current (off-state current) in a non-conduction state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, as the oxide 230, an In—Ga oxide or an In—Zn oxide may be used.

The electrical characteristics of a transistor using an oxide semiconductor tend to have variations when impurities and oxygen vacancies exist in the channel formation region of the oxide semiconductor, and the reliability decreases in some cases. Moreover, if the region of the oxide semiconductor where a channel is formed includes oxygen vacancies, the transistor tends to have normally-on characteristics. Therefore oxygen vacancies in the region where a channel is formed are preferably reduced as much as possible. For example, oxygen is preferably supplied to the oxide 230 through the insulator 250 or the like to fill the oxygen vacancies. Thus, a transistor that has stable electrical characteristics with a small variation in electrical characteristics and improved reliability can be provided.

A low-resistance region might be formed in part of a region between the oxide 230 and the conductor 242 or the vicinity of a surface of the oxide 230 when an element (for example, a second element) included in the conductor 242 (the conductor 242a and the conductor 242b) which is provided over and in contact with the oxide 230 and functions as a source electrode or a drain electrode of the transistor 200 has a function of absorbing oxygen in the oxide 230. In that case, in the low-resistance region, an impurity (such as hydrogen, nitrogen, metal elements, or the like) entering oxygen vacancies serves as a donor, which causes an increase in carrier density in some cases. Note that in the following description, hydrogen that enters oxygen vacancies is referred to as $V_OH$ in some cases. The oxide 230 includes a region functioning as a channel formation region of the transistor 200 in a region not overlapping with the conductor 242a or the conductor 242b. The region preferably has a smaller carrier density and less $V_OH$ than the low-resistance regions.

As shown in FIGS. 1(B) and 1(C), the transistor 200 of one embodiment of the present invention has a structure in which the insulator 282 and the insulator 250 are directly in contact with each other. With such a structure, oxygen contained in the insulator 280 is less likely to be absorbed into the conductor 260. Therefore, oxygen contained in the insulator 280 can be injected into the oxide 230a and the oxide 230b efficiently through the oxide 230c; hence, oxygen vacancies in the oxide 230a and the oxide 230b can be reduced and the electric characteristics and the reliability of the transistor 200 can be improved. In addition, the mixing of impurities such as hydrogen contained in the insulator 280 into the insulator 250 can be suppressed, which can inhibit the adverse effects on the electrical characteristics and the reliability of the transistor 200. For the insulator 282, silicon nitride, silicon nitride oxide, aluminum oxide, or hafnium oxide can be used.

The insulator 272 and the insulator 273 preferably have a function of inhibiting the transmission of oxygen and impurities such as hydrogen and water.

Figure 3A:
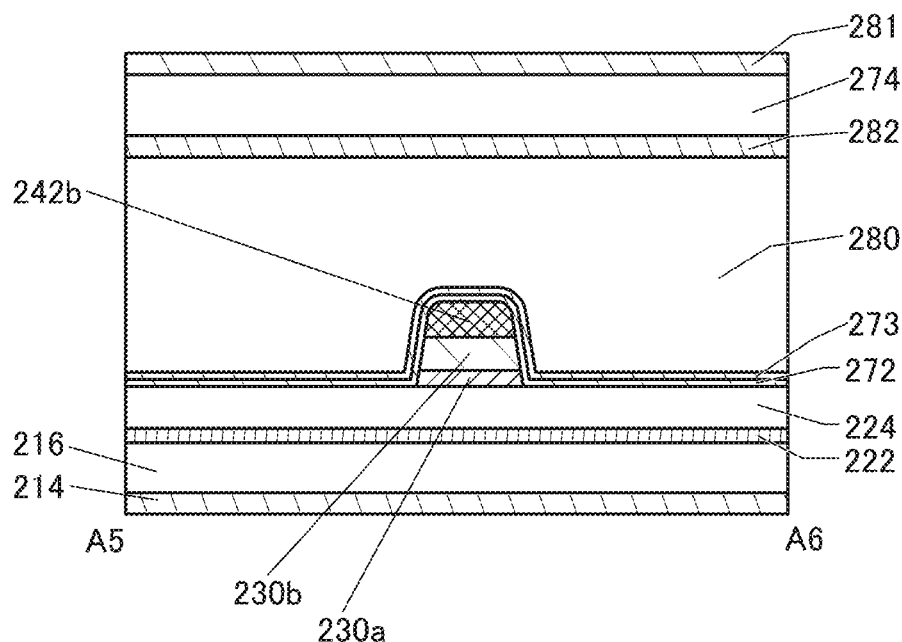
FIGS. 3A-3B Cross-sectional views of a semiconductor device of one embodiment of the present invention.

FIG. 3(A) is a cross-sectional view of a portion indicated by a dashed-dotted line A5-A6 in FIG. 1(A), and is also a cross-sectional view in the channel width direction of one of a source region and a drain region of the transistor 200. As illustrated in FIG. 3(A), a structure is employed in which the top surface of the conductor 242b, the side surface of the conductor 242b, the side surface of the oxide 230a, and the side surface of the oxide 230b are covered with the insulator 272 and the insulator 273; thus, oxygen and impurities such as hydrogen and water can be inhibited from being diffused into the conductor 242b from the side surface direction of the conductor 242b and the top surface direction of the conductor 242b and oxidation of the conductor 242b can be suppressed. Note that the same effect can be obtained in the conductor 242a. Oxygen and impurities such as hydrogen and water can be inhibited from being diffused into the oxide 203a and the oxide 230b from the side surface direction of the oxide 230a and the side surface direction of the oxide 230b. For the insulator 272, a silicon nitride film or a silicon nitride oxide film can be used. For the insulator 273, aluminum oxide or hafnium oxide can be used, for example.

Figure 3B:
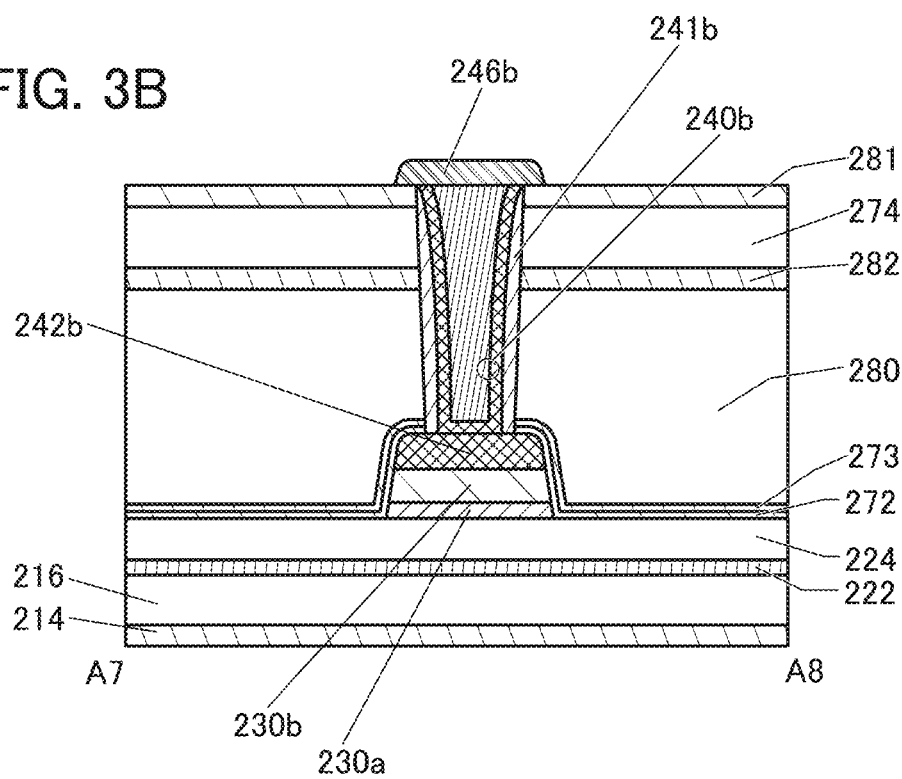
Figure 9C:
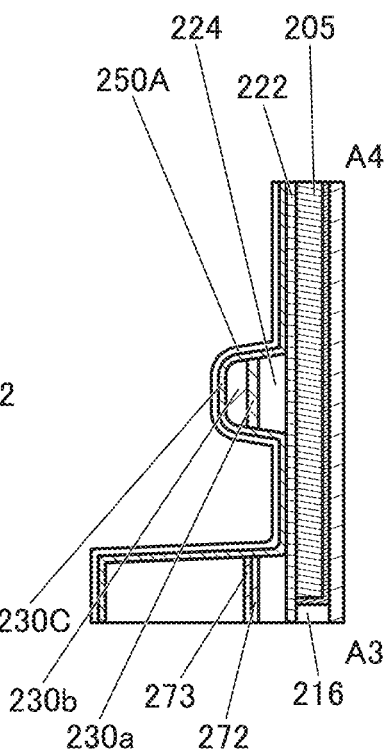
FIGS. 9A-9C A top view and cross-sectional views illustrating a fabrication method of a semiconductor device of one embodiment of the present invention.
Figure 9A:
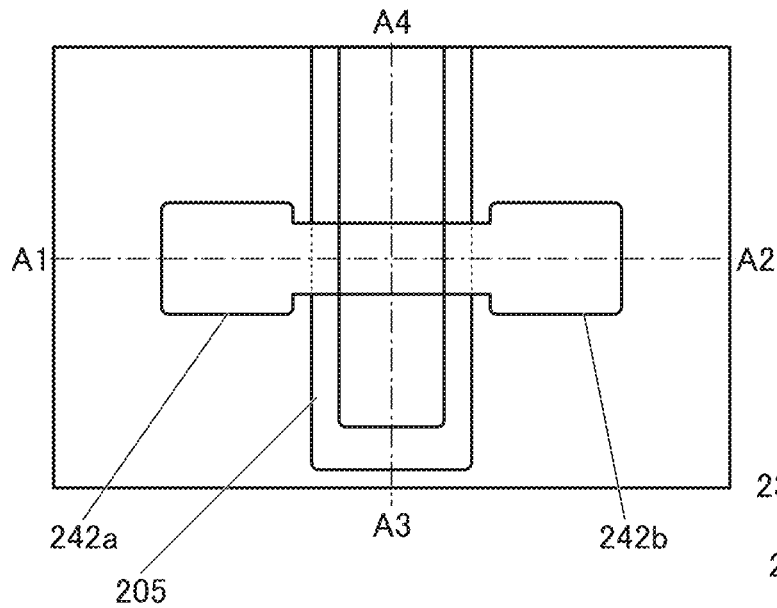
Figure 9B:
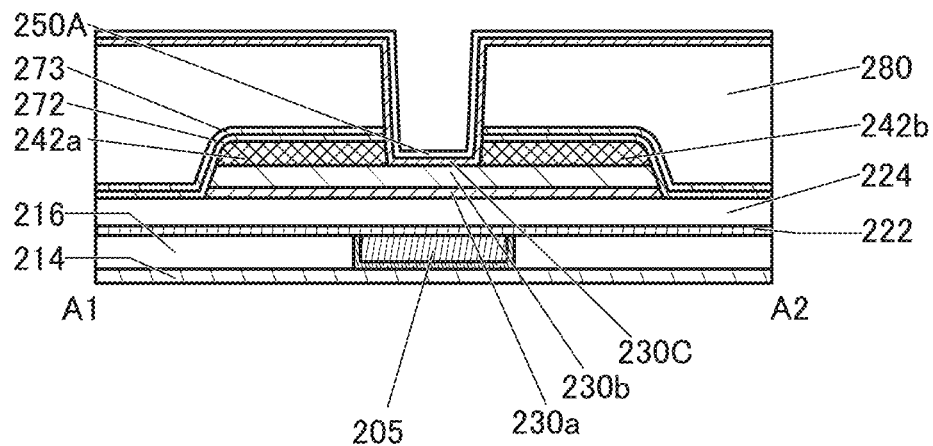

FIG. 3(B) is a cross-sectional view of a portion indicated by a dashed-dotted line A7-A8 in FIG. 1(A), which corresponds to a cross-sectional view in the channel width direction of the conductor 240b electrically connected to the transistor 200 and functioning as a plug. Since the insulator 241b is provided on a side surface of the conductor 240b as illustrated in FIG. 3(B), oxygen and impurities such as hydrogen and water from the insulator 280 can be inhibited from being diffused into the conductor 240b. Note that the same effect can be obtained in the conductor 240a.

As shown in FIG. 1(C), with the bottom surface of the insulator 224 as a reference, the height of the bottom surface of the conductor 260 in a region where the conductor 260 does not overlap with the oxide 230a and the oxide 230b is preferably lower than the height of the bottom surface of the oxide 230b. A difference between the level of the bottom surface of the conductor 260 in a region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, and further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Thus, the on-state current of the transistor 200 can be increased and the frequency characteristics of the transistor 200 can be improved.

Accordingly, a semiconductor device including a transistor with high on-state current can be provided. Alternatively, a semiconductor device including a transistor with high frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 according to one embodiment of the present invention is described below.

The conductor 205 is provided to overlap with the oxide 230 and the conductor 260. Furthermore, the conductor 205 is preferably provided to be embedded in the insulator 216.

Here, the conductor 260 sometimes functions as a first gate (also referred to as top gate) electrode. Alternatively, the conductor 205 sometimes functions as a second gate (also referred to as bottom gate) electrode. In that case, Vth of the transistor 200 can be controlled by changing a potential applied to the conductor 205 independently of a potential applied to the conductor 260. In particular, Vth of the transistor 200 can be higher than 0 V and the off-state current can be reduced by applying a negative potential to the conductor 205. Thus, drain current when a potential applied to the conductor 260 is 0 V can be lower in the case where a negative potential is applied to the conductor 205 than in the case where the negative potential is not applied to the conductor 205.

As illustrated in FIG. 1(A), the conductor 205 is preferably provided to extend in the channel width direction beyond a region of the oxide 230a and the oxide 230b that does not overlap with the conductor 242a or the conductor 242b. As illustrated in FIG. 1(C), it is particularly preferable that the conductor 205 extend to a region outside an end portion of the oxide 230a and the oxide 230b that intersects with the channel width direction. That is, the conductor 205 and the conductor 260 preferably overlap with each other with the insulators therebetween on an outer side of the side surface of the oxide 230a and the oxide 230b in the channel width direction. A large conductor 205 can sometimes reduce local charging (referred to as charge up) in a treatment using plasma of a fabrication step after the formation of the conductor 205. Note that one embodiment of the present invention is not limited thereto. The conductor 205 is at least overlapped with the oxide 230 positioned between the conductor 242a and the conductor 242b.

Since the above-described structure is included, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure. The conductor 205a is preferably a conductor that inhibits the transmission of oxygen and impurities such as water and hydrogen. For example, titanium, titanium nitride, tantalum, or tantalum nitride can be used for the conductor 205a. Moreover, the conductor 205b is preferably formed using a conductive material containing tungsten, copper, or aluminum as its main component. Although the conductor 205 is illustrated as having two layers, the conductor 205 can have a multilayer structure with three or more layers.

Here, it is preferable that as an oxide semiconductor, an insulator or a conductor positioned below the oxide semiconductor, and an insulator or a conductor positioned over the oxide semiconductor, different kinds of films are successively deposited without being exposed to the air, whereby a substantially highly purified intrinsic oxide semiconductor film whose impurity (hydrogen and water, in particular) concentration is reduced can be formed.

For example, insulating films to be the insulator 222, and the insulator 224 positioned over the insulator 216 and the conductor 205, an oxide film to be the oxide 230a, an oxide film to be the oxide 230b, and a conductive film to be the conductor 242 may be successively deposited in this order using a deposition apparatus including five treatment chambers.

The insulator 214 and the insulator 272, and the insulator 281 preferably function as a barrier insulating film that inhibits impurities such as water or hydrogen from entering the transistor 200 from the substrate side or from above. Thus, the insulator 214, the insulator 272, and the insulator 281 are preferably formed using an insulating material having a function of inhibiting diffusion of impurities (through which the impurities are unlikely to pass) such as a hydrogen atom, a hydrogen molecule, a water molecule, a nitrogen atom, a nitrogen molecule, a nitrogen oxide molecule (e.g., $N_2O$, $NO$, or $NO_2$), or a copper atom. Alternatively, it is preferable to use an insulating material having a function of inhibiting diffusion of oxygen (e.g., at least one of an oxygen atom, an oxygen molecule, and the like) (or through which the above oxygen is less likely to pass).

For example, it is preferable that silicon nitride or the like be used for the insulator 214, the insulator 272, and the insulator 281. Accordingly, impurities such as water or hydrogen can be inhibited from being diffused into the transistor 200 side from the substrate side through the insulator 214. Alternatively, oxygen contained in the insulator 224 and the like can be prevented from being diffused to the substrate side of the insulator 214. Impurities such as water or hydrogen can be inhibited from diffusing into the transistor 200 side from the insulator 280 and/or the conductor 246 and the like, which are provided above the insulator 272.

The resistivities of the insulator 214, the insulator 272, and the insulator 281 are preferably low in some cases. For example, by setting the resistivities of the insulator 214, the insulator 272, and the insulator 281 to approximately $1 \times 10^{13}$ Ωcm, the insulator 214, the insulator 272, and the insulator 281 can reduce charge up of the conductor 205, the conductor 242 or the conductor 260 in a treatment using plasma or the like of a fabrication step of a semiconductor device in some cases. The resistivities of the insulator 214, the insulator 272, and the insulator 281 are preferably higher than or equal to $1 \times 10^{10}$ Ωcm and lower than or equal to $1 \times 10^{15}$ Ωcm.

The insulator 214 may have a stacked-layer structure. For example, a stacked-layer structure of an aluminum oxide film and a silicon nitride film can be favorably used for the insulator 214. With the aluminum oxide film, oxygen can be supplied to a lower part of the insulator 214. Furthermore, diffusion of impurities such as hydrogen and water that enter the transistor 200 side from the substrate side can be suppressed by the silicon nitride film.

The insulator 216, the insulator 280, and the insulator 274 preferably have a lower permittivity than the insulator 214. When a material with a low permittivity is used for an interlayer film, the parasitic capacitance generated between wirings can be reduced. For each of the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 have a function of a gate insulator.

Here, it is preferable that oxygen be released from the insulator 224 in contact with the oxide 230 by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water and hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 272 can inhibit entry of impurities such as water or hydrogen into the transistor 200 from the outside.

Furthermore, the insulator 222 preferably has a function of inhibiting diffusion of oxygen (e.g., at least one of an oxygen atom, an oxygen molecule, and the like) (or is less likely to transmit the above oxygen). For example, the insulator 222 preferably has lower oxygen permeability than the insulator 224. When the insulator 222 has a function of inhibiting diffusion of oxygen or impurities, diffusion of oxygen included in the oxide 230 into an area below the insulator 222 can be reduced, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure using oxides which differ in the atomic ratio of metal elements. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b preferably has crystallinity. For example, a CAAC-OS described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the densities of defect states in mixed layers formed at an interface between the oxide 230a and the oxide 230b and an interface between the oxide 230b and the oxide 230c are preferably made low.

Specifically, as the oxide 230a, a metal oxide having In:Ga:Zn=1:3:4 [atomic ratio] or In:Ga:Zn=1:1:0.5 [atomic ratio] is used. As the oxide 230b, a metal oxide having In:Ga:Zn=4:2:3 [atomic ratio] or In:Ga:Zn=3:1:2 [atomic ratio] can be used. As the oxide 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Furthermore, as a specific example of the oxide 230c having a stacked-layer structure, a stacked-layer structure of a metal oxide having In:Ga:Zn=4:2:3 [atomic ratio] and a metal oxide having Ga:Zn=2:1 [atomic ratio], a stacked-layer structure of a metal oxide having In:Ga:Zn=4:2:3 [atomic ratio] and a metal oxide having Ga:Zn=2:5 [atomic ratio], or a stacked-layer structure of a metal oxide having In:Ga:Zn=4:2:3 [atomic ratio] and a gallium oxide can be given.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, not only the effect of reducing the density of defect state at the interface between the above oxide 230b and the oxide 230c but also the effect of inhibiting diffusion of a constituent element included in the oxide 230c into the insulator 250 side can be expected. More specifically, the oxide 230c has a stacked-layer structure and an oxide not including In is positioned in the upper portion of the stacked layer structure, so that In, which can diffuse into the insulator 250 side, can be inhibited. Since the insulator 250 functions as the gate insulator, the transistor has defects in characteristics if In diffuses. Thus, when the oxide 230c has a stacked-layer structure, a highly reliable semiconductor device can be provided.

As the oxide 230, a metal oxide functioning as an oxide semiconductor is preferably used. For example, a metal oxide whose energy gap is greater than or equal to 2 eV, preferably greater than or equal to 2.5 eV, is preferably used. With the use of a metal oxide having such a large energy gap, the off-state current of the transistor can be reduced. With use of such a transistor, a semiconductor device with low power consumption can be provided.

Figure 12:
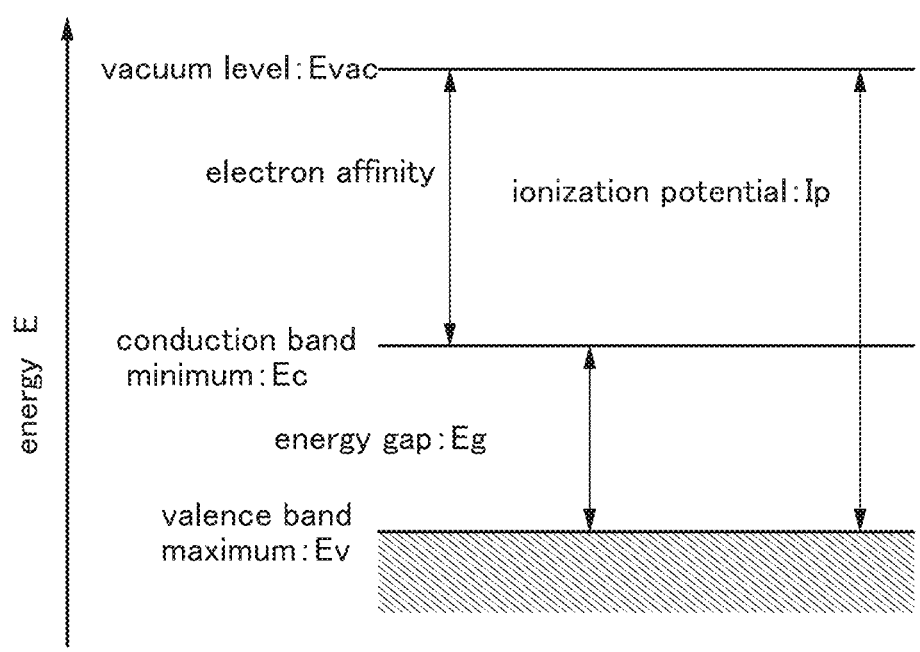
FIG. 12 A diagram illustrating an energy band structure of an oxide semiconductor.

Electron affinity or conduction band minimum Ec can be obtained from an energy gap Eg and an ionization potential Ip, which is a difference between a vacuum level and an energy of valence band maximum Ev, as shown in FIG. 12. The ionization potential $I_p$ can be measured using, for example, an ultraviolet photoelectron spectroscopy (UPS) apparatus. The energy gap $E_g$ can be measured using, for example, a spectroscopic ellipsometer.

The conductor 242 (the conductor 242a and the conductor 242b) functioning as the source electrode and the drain electrode is provided over the oxide 230b. The thickness of the conductor 242 is, for example, greater than or equal to 1 nm and less than or equal to 50 nm, preferably greater than or equal to 2 nm and less than or equal to 25 nm.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, or a nitride containing tungsten, titanium, and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, or a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

The insulator 250 is preferably formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with high relative permittivity is preferably used for the metal oxide. When the gate insulator has a stacked-layer structure of the insulator 250 and the metal oxide, the stacked-layer structure can be thermally stable and have high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or a plurality of kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

The metal oxide has a function of part of the gate electrode in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, titanium nitride, tantalum nitride, or the like can be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting oxygen diffusion, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

The conductor 260b is preferably formed using a conductive material containing tungsten, copper, or aluminum as its main component. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

For example, the insulator 280 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably lowered. In addition, the top surface of the insulator 280 may be planarized.

The insulator 282 preferably functions as a barrier insulating film that inhibits impurities such as water and hydrogen from entering the insulator 280 from the above. As the insulator 282, an insulator such as aluminum oxide, silicon nitride, or silicon nitride oxide may be used.

The insulator 274 functioning as an interlayer film is preferably provided over the insulator 282. As in the insulator 224 or the like, the concentration of impurities such as water or hydrogen in the insulator 2274 is preferably lowered.

For the conductor 240a and the conductor 240b, a conductive material containing tungsten, copper, or aluminum as its main component is preferably used. In addition, the conductor 240a and the conductor 240b may each have a stacked-layer structure.

In the case where the conductor 240 has a stacked-layer structure, a conductive material having a function of inhibiting the transmission of an impurity such as water or hydrogen is preferably used for a conductor in contact with the insulator 281, the insulator 274, the insulator 282, the insulator 280, the insulator 273, and the insulator 272. For example, tantalum, tantalum nitride, titanium, titanium nitride, ruthenium, ruthenium oxide, or the like is preferably used. A single layer or a stacked layer of the conductive material having a function of inhibiting the transmission of impurities such as water or hydrogen may be used. The use of the conductive material can prevent oxygen added to the insulator 280 from being absorbed by the conductor 240a and the conductor 240b. Moreover, the mixing of impurities such as water or hydrogen into the oxide 230 through the conductor 240a and the conductor 240b from a layer above the insulator 281 can be inhibited.

As the insulator 241a and the insulator 241b, an insulator such as aluminum oxide, silicon nitride, or silicon nitride oxide may be used. Since the insulator 241a and the insulator 241b are provided in contact with the insulator 272 and the insulator 273, the mixing of impurities such as water or hydrogen into the oxide 230 through the conductor 240a and the conductor 240b from the insulator 280 or the like can be inhibited. In addition, oxygen contained in the insulator 280 can be prevented from being absorbed by the conductor 240a and the conductor 240b.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure; for example, stacked layers of the above conductive material, and titanium or titanium nitride. Note that the conductor may be formed to be embedded in an opening provided in an insulator.

<Constituent Material of Semiconductor Device>

Constituent materials that can be used for the semiconductor device are described below.

<Substrate>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as a gate insulator, the voltage when the transistor operates can be reduced while keeping the physical thickness of the gate insulator. In contrast, when a material with low relative permittivity is used for the insulator functioning as an interlayer film, parasitic capacitance generated between wirings can be reduced. Thus, a material is preferably selected depending on the function of an insulator.

In addition, examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

Furthermore, when a transistor using an oxide semiconductor is surrounded by an insulator having a function of inhibiting the transmission of oxygen and impurities such as hydrogen, the electrical characteristics of the transistor can be stable. For the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be applied to the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor.

The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration of an alkali metal or an alkaline earth metal obtained by secondary ion mass spectrometry) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

Note that as a metal oxide used for a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a CPU with low power consumption utilizing a characteristic of a low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the property of low leakage current of the transistor have been studied.

<Fabrication Method of Semiconductor Device>

Next, a method for fabricating a semiconductor device including the transistor 200 according to the present invention, which is illustrated in FIG. 1, will be described with reference to FIG. 4 to FIG. 11. In FIG. 4 to FIG. 11, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Moreover, (C) in each drawing is a cross-sectional view corresponding to a portion indicated by a dashed-dotted line A3-A4 in (A), and is also a cross-sectional view of the transistor 200 in the channel width direction. Note that for clarity of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In addition, in an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and thus is suitable for covering a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case of depositing a film while changing the flow rate ratio of source gases, as compared with the case of depositing a film with use of a plurality of deposition chambers, time taken for the deposition can be shortened because time taken for transfer and pressure adjustment is not required. Thus, the productivity of the semiconductor device can be increased in some cases.

In this embodiment, for the insulator 214, silicon nitride is deposited by a CVD method. As described here, an insulator through which copper such as silicon nitride is less likely to pass, is used for the insulator 214; accordingly, even when a metal that is likely to diffuse copper or the like is used for a conductor of a lower layer (not illustrated) of the insulator 214, diffusion of the metal into the upper layer of the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Note that examples of the opening include a groove and a slit. A region where the opening is formed may be referred to as an opening portion. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film preferably includes a conductor that has a function of inhibiting the transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Even when a metal that is likely to diffuse, such as copper, is used for an upper layer of the conductive film to be the conductor 205 described below, the use of such metal nitrides for a lower layer of the conductive film to be the conductor 205 can prevent outward diffusion of the metal from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film of the upper layer of the conductive film to be the conductor 203, a low-resistance conductive material such as copper is deposited.

Next, CMP treatment is performed to remove parts of the upper layer of the conductive film to be the conductor 205 and the lower layer of the conductive film to be the conductor 205, so that the insulator 216 is exposed. As a result, the conductive film to be the conductor 205 remains only in the opening portion. Thus, the conductor 205 whose top surface is flat can be formed. Note that the insulator 216 is partly removed by the CMP treatment in some cases (see FIG. 4).

Here, a method for forming the conductor 205 which is different from the above will be described below.

Next, the conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 203, forming a resist mask thereover, and then etching the hard mask material. The etching of the conductive film to be the conductor 203 may be performed after removal of the resist mask or with the resist mask remaining. In the latter case, the resist mask sometimes disappears during the etching. The hard mask may be removed by etching after the etching of the conductive film to be the conductor 203. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulator to be the insulator 216 can be deposited by a sputtering method, a CVD method, an MBE method, a PLD method, an ALD method, or the like. In this embodiment, for the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the thickness of the conductor 205 is 150 nm and the thickness of the insulating film to be the insulator 216 is 350 nm.

Figure 2A:
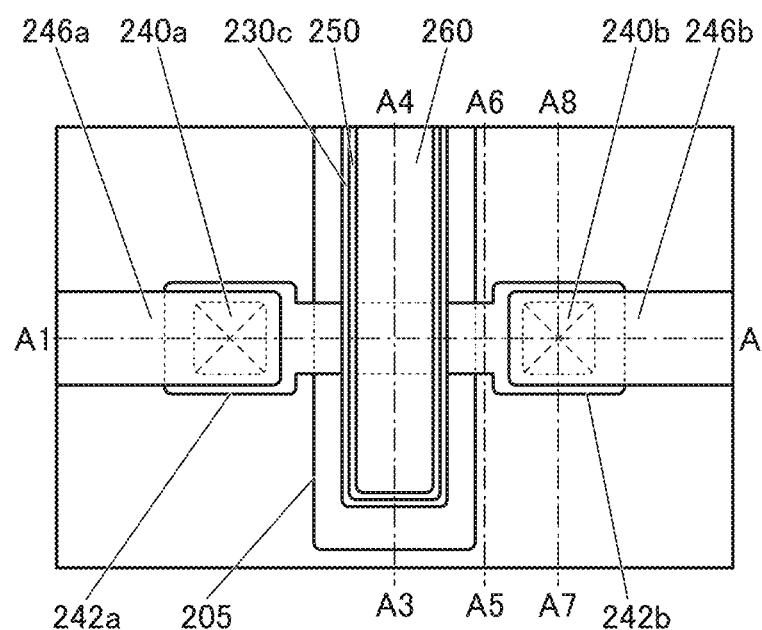
FIGS. 2A-2C A top view and cross-sectional views of a semiconductor device of one embodiment of the present invention.
Figure 2C:
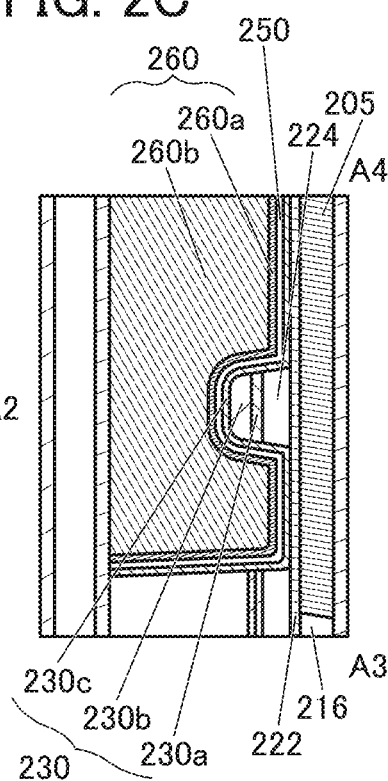
Figure 2B:
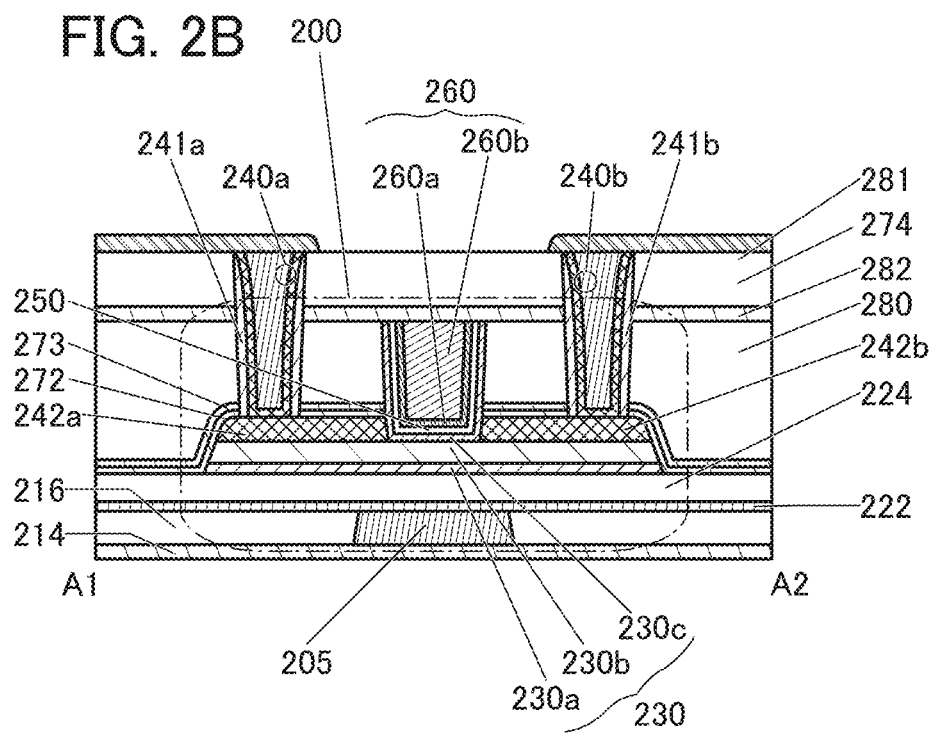

Next, CMP (chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed. The above is the different method for forming the conductor 205. FIG. 2 illustrates an example of a semiconductor device including the transistor 200 in which the conductor 205 and the insulator 216 are formed in the above manner.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulating film to be the insulator 224 is deposited over the insulator 222. The insulating film to be the insulator 224 can be deposited by a sputtering method, a CVD method, an MBE method, a PLD method, an ALD method, or the like.

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at 10 ppm or more, 1% or higher, or 10% of higher. Alternatively, the heat treatment may be performed under reduced pressure. Alternatively, the heat treatment may be performed by performing heat treatment in a nitrogen or inert gas atmosphere and then performing heat treatment in an atmosphere containing an oxidizing gas at 10 ppm or higher, 1% or higher, or 10% or higher to compensate for released oxygen.

In this embodiment, treatment is performed at 400° C. in a nitrogen atmosphere for 1 hour, and treatment is successively performed at 400° C. in an oxygen atmosphere for 1 hour. By the heat treatment, impurities such as water and hydrogen contained in the insulator 224 can be removed.

The above heat treatment may be performed after the insulator 222 is deposited. For the heat treatment, the conditions for the above-described heat treatment can be used.

Here, in order to form an excess-oxygen region in the insulator 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Here, aluminum oxide may be deposited over the insulator 224 by a sputtering method and the aluminum oxide may be subjected to CMP until the insulator 224 is reached. The CMP treatment can planarize the surface of the insulator 224 and smooth the surface of the insulator 224. When the CMP treatment is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A to be the oxide 230a and an oxide film 230B to be the oxide 230b are deposited in this order over the insulator 224 (see FIG. 4). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, the above In-M-Zn oxide target can be used.

In particular, part of oxygen contained in the sputtering gas is supplied to the insulator 224 during the deposition of the oxide film 230A in some cases. Therefore, the proportion of oxygen contained in the sputtering gas for the oxide film 230A is higher than or equal to 70%, preferably higher than or equal to 80%, further preferably 100%.

In addition, in the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. In addition, the oxide film 230B is deposited by a sputtering method using a target with In:Ga:Zn=4:2:4.1 [atomic ratio]. Note that each of the oxide films is formed to have characteristics required for the oxide 230 by selecting the deposition condition and the atomic ratio as appropriate.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, a conductive film 242A is deposited over an oxide film 232B. The conductive film 242A can be deposited by a sputtering method, a CVD method, an MBE method, a PLD method, an ALD method, or the like (see FIG. 4).

Next, the oxide film 230A, the oxide film 230B, and the conductive film 242A are processed into island shapes to form the oxide 230a, the oxide 230b, and a conductor layer 242B. Note that in the step, the thickness of a region of the insulator 224 which does not overlap with the oxide 230a becomes small in some cases (see FIG. 5).

Here, the oxide 230a, the oxide 230b, and the conductor layer 242B are formed to at least partly overlap with the conductor 205. It is preferable that the side surfaces of the oxide 230a, the oxide 230b, and the conductor layer 242B be substantially perpendicular to the top surface of the insulator 222. When the side surfaces of the oxide 230a, the oxide 230b, and the conductor layer 242B are substantially perpendicular to the top surface of the insulator 222, the plurality of transistors 200 can be provided in a smaller area and at a higher density. Alternatively, a structure may be employed in which an angle formed by the side surfaces of the oxide 230a, the oxide 230b, and the conductor layer 242B and the top surface of the insulator 222 is a small angle. In that case, the angle formed by the side surfaces of the oxide 230a, the oxide 230b, and the conductor layer 242B and the top surface of the insulator 222 is preferably greater than or equal to 60° and less than 70°. With such a shape, in a later step, the coverage with the insulator 272 and the like can be improved, so that defects such as a void can be reduced.

There is a curved surface between the side surface of the conductor layer 242B and the top surface of the conductor layer 242B. That is, an end portion of the side surfaces and an end portion of the top surface are preferably curved (such shapes are hereinafter also referred to as rounded shapes). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, coverage with films in a later deposition process can be improved.

Note that for the processing of the oxide films and the conductive film, a lithography method can be employed. In addition, a dry etching method or a wet etching method can be used for the processing. Processing by a dry etching method is suitable for microfabrication.

Next, an insulating film 272A is deposited over the insulator 224, the oxide 230a, the oxide 230b, and the conductor layer 242B (see FIG. 6).

The insulating film 272A can be deposited by a sputtering method, a CVD method, an MBE method, a PLD method, an ALD method, or the like. As the insulating film 272A, an insulating film having a function of inhibiting the transmission of oxygen is preferably used. In this embodiment, silicon nitride is deposited by a sputtering method.

Then, an insulating film 273A is deposited over the insulating film 272A. The insulating film 273A can be deposited by a sputtering method, a CVD method, an MBE method, a PLD method, an ALD method, or the like. For example, an aluminum oxide film is preferably deposited by a sputtering method. In this embodiment, an aluminum oxide film is deposited by a sputtering method (see FIG. 6).

Next, an insulating film to be the insulator 280 is deposited over the insulating film 273A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 7).

Then, part of the insulator 280, part of the insulating film 273A, part of the insulating film 272A, and part of the conductor layer 242B are processed to form an opening reaching the oxide 230b. The opening is preferably formed to overlap with the conductor 205. The conductor 242a, the conductor 242b, the insulator 272, and the insulator 273 are formed by the opening (see FIG. 7).

Part of the insulator 280, part of the insulating film 273A, part of the insulating film 272A, and part of the conductor layer 242B may be processed under different conditions. For example, part of the insulator 280 may be processed by a dry etching method, part of the insulating film 273A may be processed by a wet etching method, and part of the insulating film 272A and part of the conductor layer 242B may be processed by a dry etching method.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, ammonia water, a hydrofluoric acid, or the like with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment removes moisture and hydrogen adsorbed onto the surface onto the surface of the oxide 230b and the like, and reduces moisture concentration and hydrogen concentration in the oxide 230a and the oxide 230b. The heat treatment is preferably performed at a temperature higher than or equal to 100° C. and lower than or equal to 400° C. In this embodiment, the heat treatment is performed at 200° C. (see FIG. 8).

The oxide film 230C can be deposited by a sputtering method, a CVD method, an MBE method, a PLD method, an ALD method, or the like. An oxide film to be the oxide film 230C is deposited by a method similar to that for the oxide film to be the oxide film 230A or the oxide film 230B in accordance with characteristics required for the oxide film 230C. In this embodiment, the oxide film 230C is deposited by a sputtering method using a target with In:Ga:Zn=4:2:4.1 [atomic ratio].

The oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In particular, in the deposition of the oxide film 230C, part of oxygen contained in the sputtering gas is supplied to the oxide 230a and the oxide 230b, in some cases. Therefore, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 9).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 10).

Figure 11A:
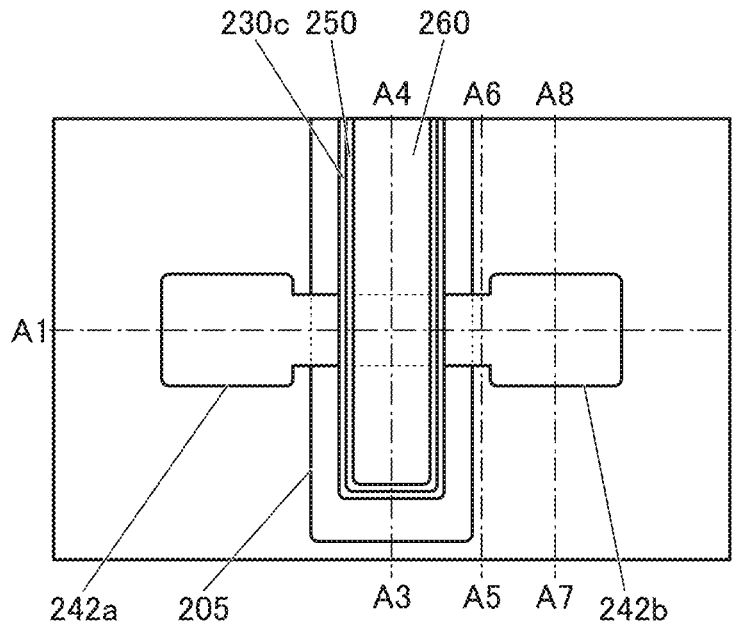
FIGS. 11A-11C A top view and cross-sectional views illustrating a fabrication method of a semiconductor device of one embodiment of the present invention.
Figure 11C:
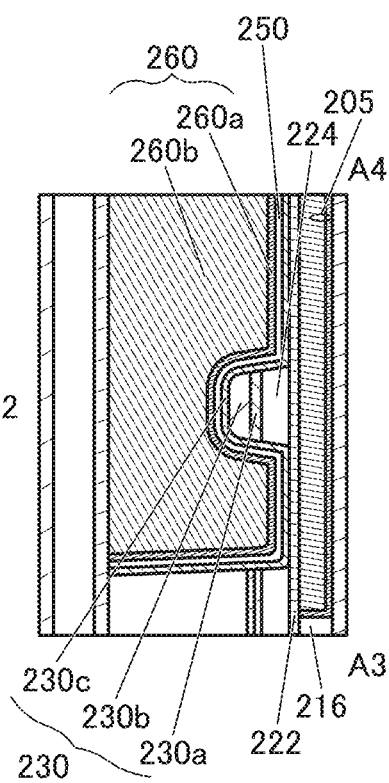
Figure 11B:
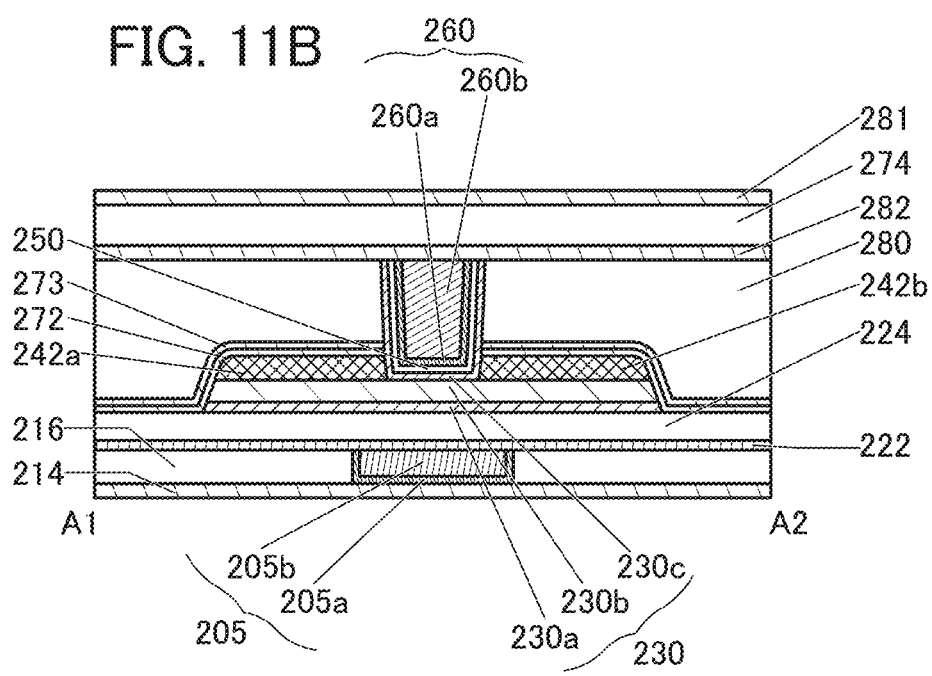

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 11).

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, an insulating film to be the insulator 282 may be formed over the conductor 260, the oxide 230c, the insulator 250, and the insulator 280. The insulating film to be the insulator 282 can be deposited by a sputtering method, a CVD method, an MBE method, a PLD method, an ALD method, or the like. An aluminum oxide is preferably deposited as the insulating film to be the insulator 282 by a sputtering method, for example. It is preferable to form the insulator 282 in contact with the top surface of the conductor 260 in this manner because oxygen included in the insulator 280 can be inhibited from being absorbed into the conductor 260 in a later heat treatment (see FIG. 11).

Next, heat treatment may be performed. In this embodiment, the treatment is performed at 400° C. in a nitrogen atmosphere for one hour. By the heat treatment, oxygen added by the deposition of the insulator 282 can be injected into the oxide 230 through the insulator 250.

Next, an insulator to be the insulator 274 may be deposited over the insulator 282. An insulating film to be the insulator 274 can be deposited by a sputtering method, a CVD method, an MBE method, a PLD method, an ALD method, or the like (see FIG. 11).

Next, an insulator to be the insulator 281 may be deposited over the insulator 274. An insulating film to be the insulator 281 can be deposited by a sputtering method, a CVD method, an MBE method, a PLD method, an ALD method, or the like. Silicon nitride is preferably deposited as the insulating film to be the insulator 281 by a sputtering method, for example (see FIG. 11).

Next, openings reaching the conductor 242a and the conductor 242b are formed in the insulator 272, the insulator 273, the insulator 280, the insulator 282, the insulator 274, and the insulator 281. The openings may be formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. An insulating film having a function of inhibiting the transmission of oxygen is preferably used as the insulating film to be the insulator 241. For example, an aluminum oxide film is preferably deposited by an ALD method. In addition, for the anisotropic etching, a dry etching method or the like may be employed, for example. When sidewall portions of the openings have such structures, the transmission of oxygen from the outside can be inhibited and oxidation of the conductor 240a and the conductor 240b to be formed next can be prevented. Furthermore, impurities such as water and hydrogen can be prevented from being diffused from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting transmission of impurities such as water and hydrogen. For example, a stacked layer of tantalum nitride, titanium nitride, or the like and tungsten, molybdenum, copper, or the like can be employed. A conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 1). Note that the insulator 281 is partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 1).

Through the above process, the semiconductor device including the transistor 200 illustrated in FIG. 1 can be fabricated. As illustrated in FIG. 4 to FIG. 11, with the use of the method of manufacturing the semiconductor device described in this embodiment, the transistor 200 can be fabricated.

According to one embodiment of the present invention, it is possible to provide a semiconductor device having a high on-state current. Alternatively, according to one embodiment of the present invention, it is possible to provide a semiconductor device with high frequency characteristics. Alternatively, according to one embodiment of the present invention, it is possible to provide a semiconductor device having favorable reliability. Alternatively, according to one embodiment of the present invention, it is possible to provide a semiconductor device that can be miniaturized or highly integrated. Alternatively, according to one embodiment of the present invention, it is possible to provide a semiconductor device with favorable electrical characteristics. Alternatively, according to one embodiment of the present invention, it is possible to provide a semiconductor device with low off-state current. Alternatively, according to one embodiment of the present invention, it is possible to provide a semiconductor device with reduced power consumption. Alternatively, according to one embodiment of the present invention, it is possible to provide a semiconductor device with high productivity.

The structure, method, and the like described above in this embodiment can be used in combination as appropriate with the structures, methods, and the like described in the other embodiments and the example.

Embodiment 2

In this embodiment, one embodiment of a semiconductor device will be described using FIG. 13 and FIG. 14.
[Memory Device 1]

Figure 13:
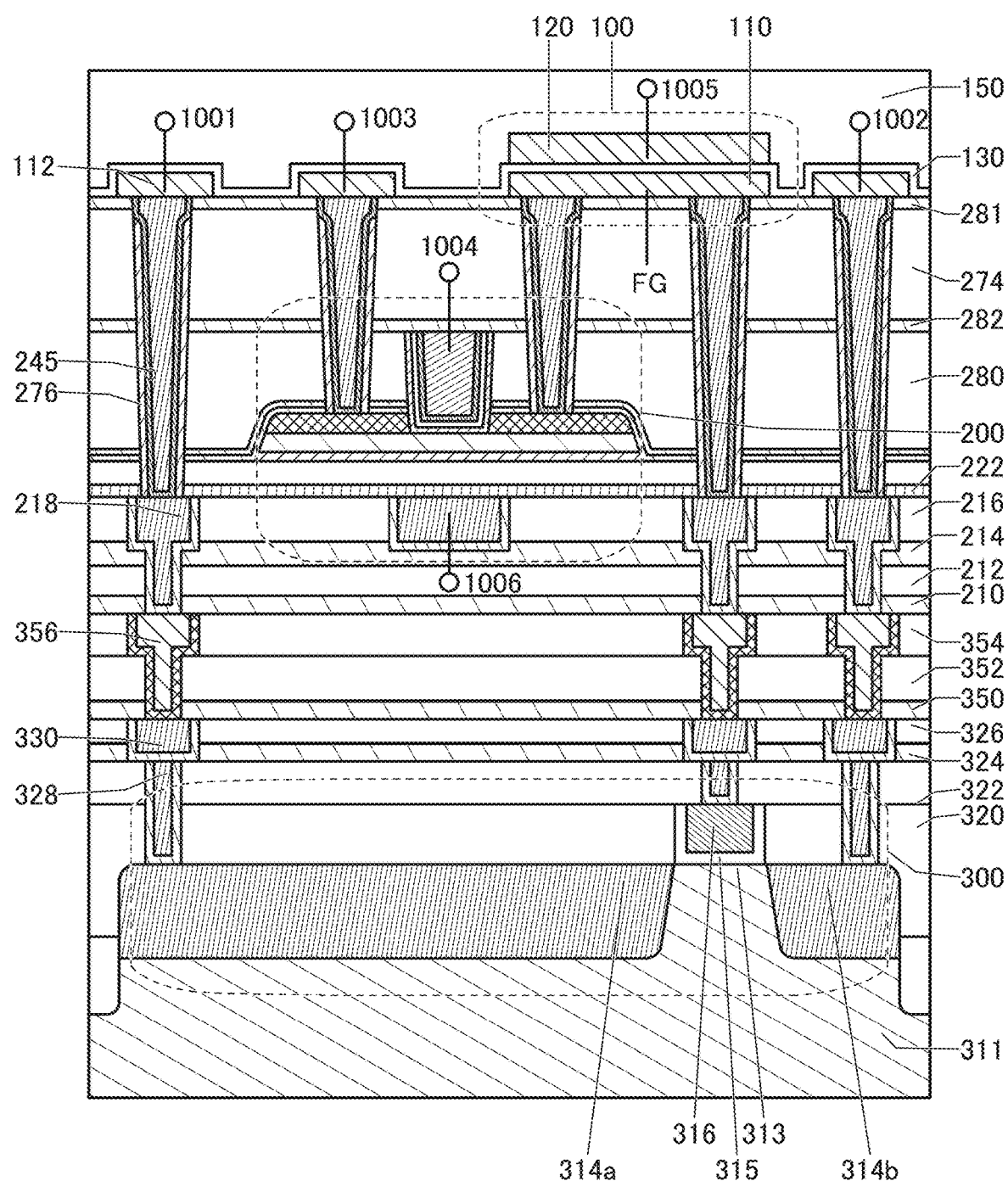
FIG. 13 A cross-sectional view illustrating a structure of a memory device of one embodiment of the present invention.

An example of a semiconductor device (a memory device) using a capacitor of one embodiment of the present invention is described in FIG. 13. In a semiconductor device of one embodiment of the present invention, the transistor 200 is provided above a transistor 300, and a capacitor 100 is provided above the transistor 300 and the transistor 200. Note that the transistor 200 described in the above embodiment or the like can be used as the transistor 200.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

In the semiconductor device illustrated in FIG. 13, a wiring 1001 is electrically connected to a source of the transistor 300, and a wiring 1002 is electrically connected to a drain of the transistor 300. In addition, a wiring 1003 is electrically connected to one of a source and a drain of the transistor 200, a wiring 1004 is electrically connected to a first gate of the transistor 200, and a wiring 1006 is electrically connected to a second gate of the transistor 200. Furthermore, a gate of the transistor 300 and the other of the source and the drain of the transistor 200 are electrically connected to one electrode of the capacitor 100, and a wiring 1005 is electrically connected to the other electrode of the capacitor 100.

Furthermore, by arranging the memory devices illustrated in FIG. 13 in a matrix, a memory cell array can be formed.
<Transistor 300>

The transistor 300 is provided on a substrate 311 and includes a conductor 316 functioning as a gate electrode, an insulator 315 functioning as a gate insulator, a semiconductor region 313 formed of part of the substrate 311, and a low-resistance region 314a and a low-resistance region 314b functioning as a source region and a drain region. The transistor 300 is either a p-channel transistor or an n-channel transistor.

Here, in the transistor 300 illustrated in FIG. 13, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting a work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 13 is an example and the structure is not limited thereto; an appropriate transistor may be used in accordance with a circuit configuration or a driving method.
<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over a conductor 246 can be formed at the same time. Note that the conductor 112 has a function of a plug or a wiring that is electrically connected to the capacitor 100, the transistor 200, or the transistor 300.

The conductor 112 and the conductor 110 illustrated in FIG. 13 each have a single-layer structure; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

In addition, the insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength such as silicon oxynitride and a high-permittivity (high-k) material for the insulator 130. In the capacitor 100 having such a structure, sufficient capacitance can be secured because a high-permittivity (high-k) insulator is included, and dielectric strength can be improved because an insulator with high dielectric strength is included, so that the electrostatic breakdown of the capacitor 100 can be inhibited.

Note that examples of the insulator of the high-permittivity (high-k) material (material with high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Meanwhile, examples of the material with high dielectric strength (material with low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.
<Wiring Layer>

Wiring layers provided with an interlayer film, a wiring, a plug, and the like may be provided between the components. In addition, a plurality of wiring layers can be provided in accordance with design. Here, a plurality of conductors having functions of plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 13, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in the insulator 210, an insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having low relative permittivity is used for the insulator functioning as an interlayer film, parasitic capacitance generated between wirings can be reduced. Thus, a material is preferably selected depending on the function of an insulator.

For example, for the insulator 150, the insulator 212, the insulator 352, the insulator 354, or the like, an insulator having a low dielectric constant is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low relative permittivity. Examples of the resin include polyester, polyolefin, polyamide (nylon, aramid, or the like), polyimide, polycarbonate, and acrylic.

Furthermore, when a transistor using an oxide semiconductor is surrounded by an insulator having a function of inhibiting the transmission of oxygen and impurities such as hydrogen, the electrical characteristics of the transistor can be stable. Thus, an insulator having a function of inhibiting the transmission of oxygen and impurities such as hydrogen is used for the insulator 210, the insulator 350, or the like.

For the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

Note that in the case where an oxide semiconductor is used for the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, an insulator 276 is preferably provided between the insulator 224 including excess oxygen and the conductor 246 in FIG. 13. Since the insulator 276 is provided in contact with the insulator 222 and the insulator 274, the insulator 224 and the transistor 200 can be sealed by the insulators having barrier properties. Furthermore, the insulator 276 is preferably in contact with the insulator 280. When the insulator 276 extends to the insulator 280, the diffusion of oxygen and impurities can be further inhibited.

That is, provision of the insulator 276 can inhibit the absorption of excess oxygen contained in the insulator 224 by the conductor 246. In addition, by including the insulator 276, the diffusion of hydrogen, which is an impurity, into the transistor 200 through the conductor 246 can be inhibited.

The insulator 276 is preferably formed using an insulating material having a function of inhibiting diffusion of an impurity such as water or hydrogen and oxygen. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The above is the description of the structure example. With use of the structure, changes in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

[Memory Device 2]

Figure 14:
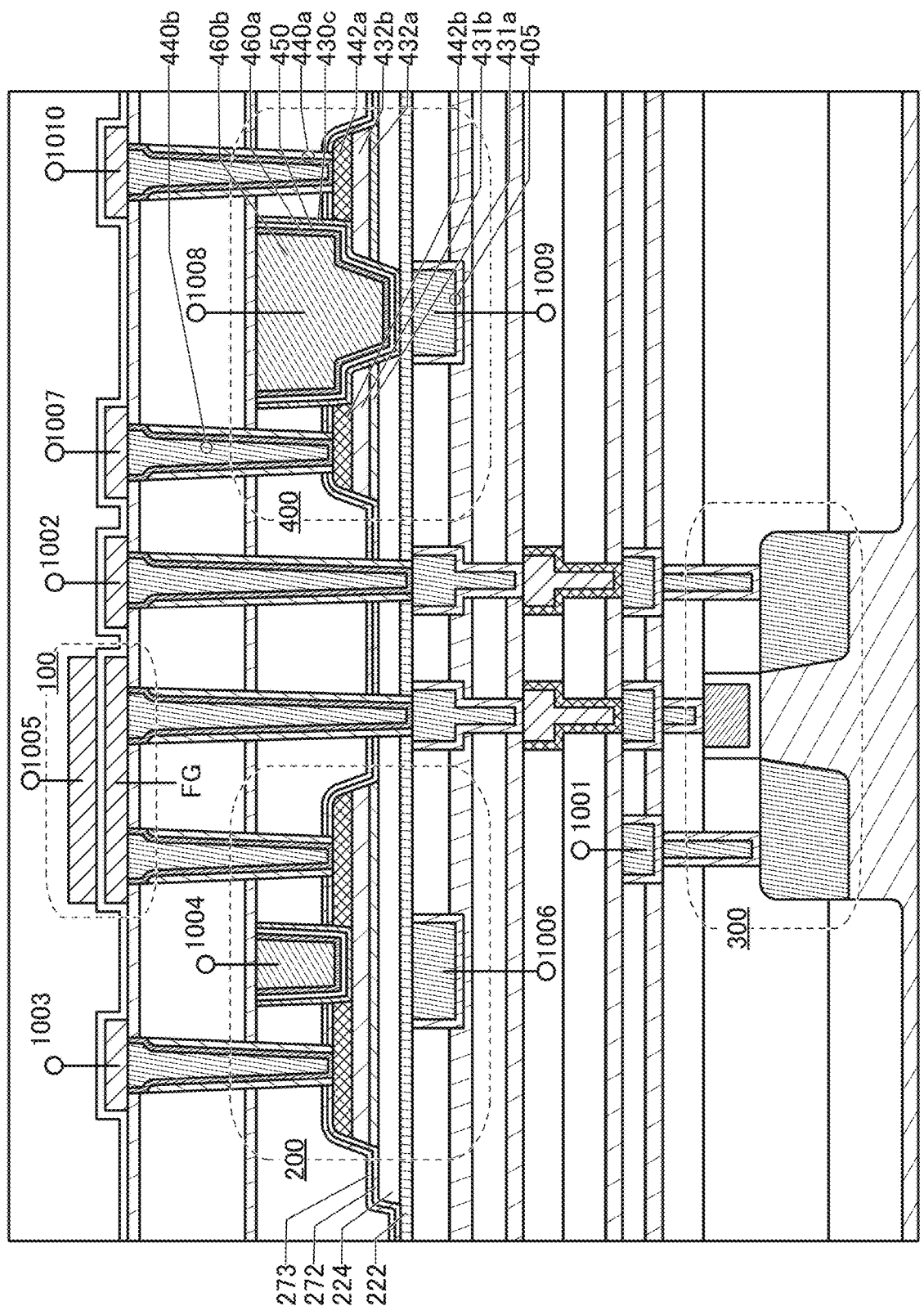
FIG. 14 A cross-sectional view illustrating a structure of a memory device of one embodiment of the present invention.

FIG. 14 illustrates an example of a memory device using the semiconductor device of one embodiment of the present invention. The memory device illustrated in FIG. 14 includes a transistor 400 in addition to the semiconductor device including the transistor 200, the transistor 300, and the capacitor 100 illustrated in FIG. 13.

The transistor 400 can change a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

Accordingly, in FIG. 14, the wiring 1001 is electrically connected to the source of the transistor 300, and the wiring 1002 is electrically connected to a drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. Furthermore, the gate of the transistor 300 and the other of the source and the drain of the transistor 200 are electrically connected to one electrode of the capacitor 100, and a wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to a drain of the transistor 400. The wiring 1006, the wiring 1007, the wiring 1008, and the wiring 1009 are electrically connected to each other.

When the memory devices illustrated in FIG. 14 are arranged in a matrix like the memory devices illustrated in FIG. 13, a memory cell array can be formed. Note that one transistor 400 can change second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as the first gate electrode; a conductor 405 functioning as the second gate electrode; the insulator 220, the insulator 222, the insulator 224, and an insulator 450 each functioning as a gate insulating layer; an oxide 430c including a region where a channel is formed; a conductor 442a functioning as one of the source and the drain; an oxide 431a and an oxide 431b; a conductor 442b functioning as the other of the source and the drain; an oxide 432a and an oxide 432b; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 430c is in the same layer as the oxide 230c. The insulator 450 is in the same layer as the insulator 250. The conductor 460 is in the same layer as the conductor 260.

Note that the structure body in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<Dicing Line>

Here, a dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 14, it is preferable that a region in which the insulator 272 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 272 is provided to cover the side surface of the insulator 224.

That is, in the opening provided in the insulator 224, the insulator 222 is in contact with the insulator 272. For example, the insulator 222 and the insulator 272 may be formed using the same material and the same method. When the insulator 222 and the insulator 272 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 272. Since the insulator 222 and the insulator 272 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be inhibited.

In the structure, excess oxygen in the insulator 224 can be inhibited from diffusing into the outside of the insulator 272 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

This embodiment can be implemented in an appropriate combination with the structures described in the other embodiments, examples, and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 15 and FIG. 16. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Configuration Example of Memory Device>

Figure 15A:
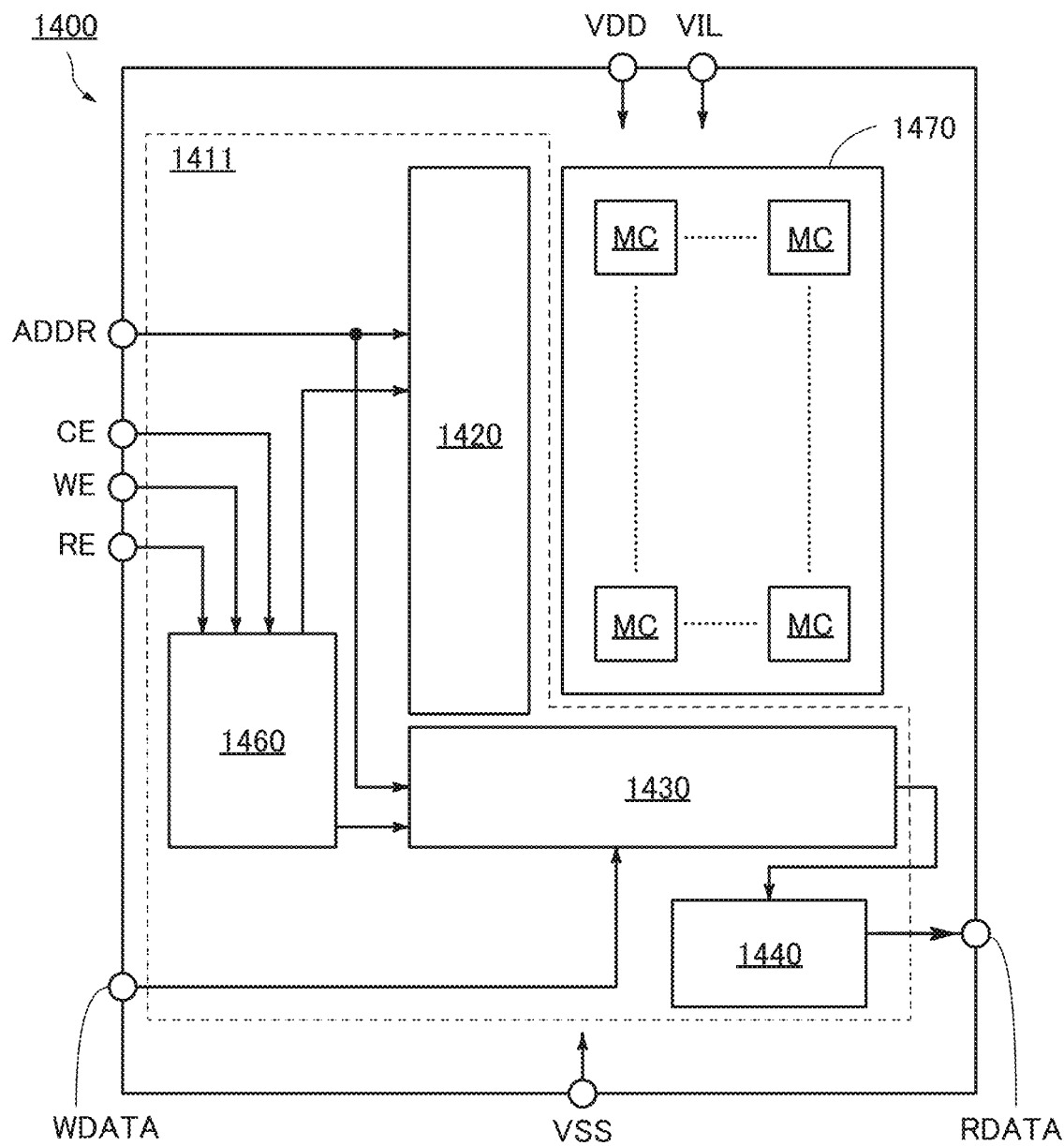
FIGS. 15A-15B A block diagram and a schematic view illustrating a configuration example of a memory device of one embodiment of the present invention.

FIG. 15(A) illustrates a configuration example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a digital data signal RDATA through the output circuit 1440. Furthermore, the row circuit 1420 includes, for example, a row decoder, a word line driver circuit, and the like, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. An address signal ADDR is input to the row decoder and the column decoder, and WDATA is input to the write circuit.

The control logic circuit 1460 processes signals (CE, WE, and RE) input from the outside, and generates control signals for the row decoder or the column decoder. CE denotes a chip enable signal, WE denotes a write enable signal, and RE denotes a read enable signal. Signals processed by the control logic circuit 1460 are not limited thereto, and other input signals can be processed to generate control signals for the row decoder or the column decoder as necessary.

The memory cell array 1470 includes a plurality of memory cells MC and a plurality of wirings arranged in a matrix. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 15B:
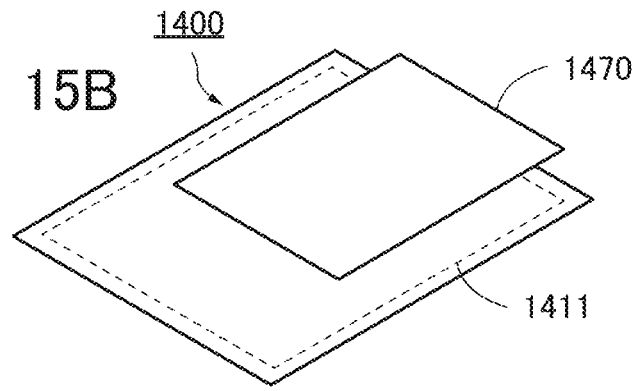

Note that FIG. 15(A) illustrates an example in which the peripheral circuit 1411 and the memory cell array 1470 are formed on the same plane; however, this embodiment is not limited thereto. For example, as illustrated in FIG. 15(B), the memory cell array 1470 may be provided over part of the peripheral circuit 1411 to overlap with the peripheral circuit 1411. For example, a structure may be employed in which the sense amplifier is provided below the memory cell array 1470 to overlap with the memory cell array 1470.

FIG. 16 illustrates configuration examples of a memory cell applicable to the memory cell MC.

[DOSRAM]

Figure 16A:
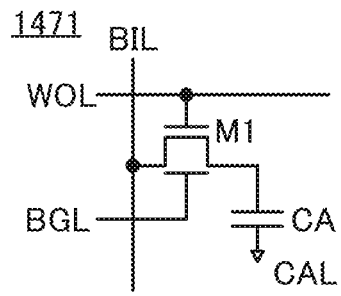
FIGS. 16A-16H Circuit diagrams each illustrating a configuration example of a memory device of one embodiment of the present invention.
Figure 16B:
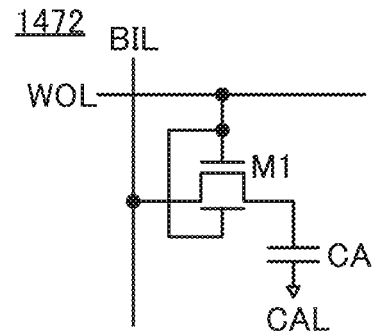
Figure 16C:
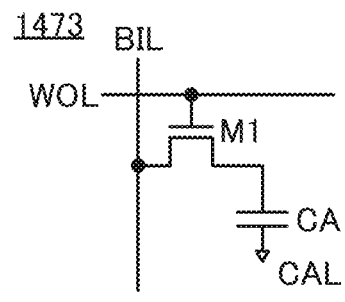
Figure 16D:
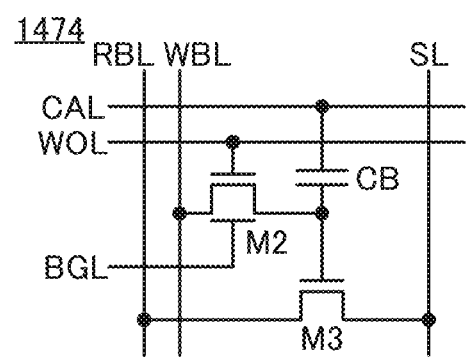
Figure 16E:
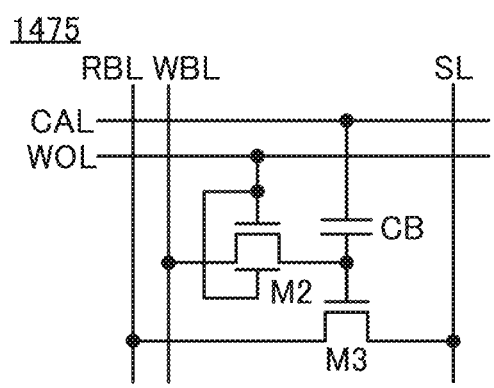
Figure 16F:
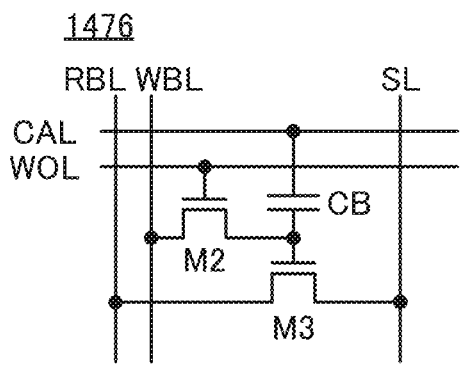
Figure 16G:
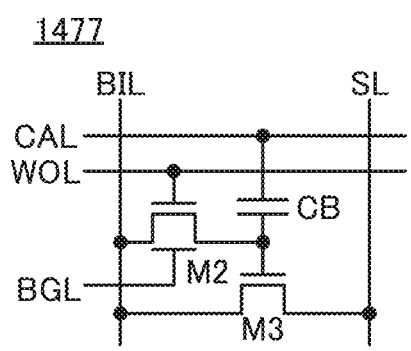

FIGS. 16(A) to 16(C) illustrate circuit configuration examples of a memory cell of a DRAM. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 16(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and its circuit configuration can be changed. For example, like a memory cell 1472 illustrated in FIG. 16(B), a structure may be employed in which the back gate of the transistor M1 is connected not to the wiring BGL but to the wiring WOL in the memory cell MC. Alternatively, for example, like a memory cell 1473 illustrated in FIG. 16(C), the memory cell MC may be a memory cell including a single-gate transistor, that is, the transistor M1 that does not include a back gate.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the use of the transistor M1; thus, the frequency of refresh of the memory cell can be reduced. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, providing a sense amplifier below the memory cell array 1470 so that they overlap each other as described above can shorten the bit line. This reduces the bit line capacity, which reduces the storage capacity of the memory cell.

[NOSRAM]

FIGS. 16(D) to 16(G) each illustrate a circuit configuration example of a gain-cell memory cell including two transistors and one capacitor. A memory cell 1474 illustrated in FIG. 16(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and its circuit configuration can be changed as appropriate. For example, like a memory cell 1475 illustrated in FIG. 16(E), a configuration may be employed in which the back gate of the transistor M2 is connected not to the wiring BGL but to the wiring WOL in the memory cell MC. Alternatively, for example, like a memory cell 1476 illustrated in FIG. 16(F), the memory cell MC may be a memory cell including a single-gate transistor, that is, the transistor M2 that does not include a back gate. As another example of the memory cell MC, the wiring WBL and the wiring RBL may be combined into one wiring BIL, as in a memory cell 1477 illustrated in FIG. 16(G).

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the use of the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cells 1475 to 1477.

Note that the transistor M3 may be a transistor containing silicon in a channel formation region (hereinafter such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be formed using only n-channel transistors.

Figure 16H:
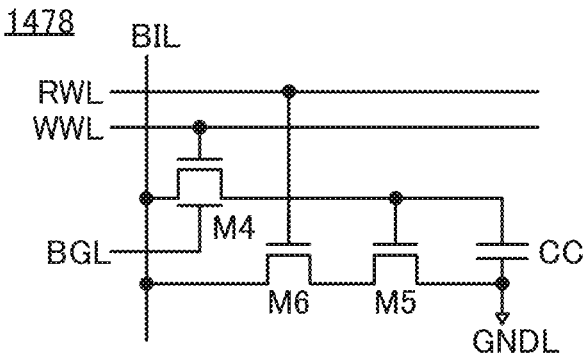

FIG. 16(H) illustrates an example of a gain-cell memory cell including three transistors and one capacitor. A memory cell 1478 illustrated in FIG. 16(H) includes transistors M4 to M6 and a capacitor CC. The capacitor CC is provided as necessary. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be an OS transistor. In that case, a circuit including the memory cell array 1470 using only n-channel transistors can be configured.

In the case where the semiconductor device described in the above embodiment is used in the memory cell 1478, the transistor 200 can be used as the transistor M4, the transistor 300 can be used as the transistors M5 and M6, and the capacitor 100 can be used as the capacitor CC. The use of an OS transistor as the transistor M4 enables the leakage current of the transistor M4 to be extremely low.

Note that the configurations of a peripheral circuit 1411, the memory cell array 1470, and the like shown in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 4

In this embodiment, an example of a chip 1200 on which the semiconductor device of the present invention is mounted will be described with reference to FIG. 17. A plurality of circuits (systems) are mounted on the chip 1200. The technique for integrating a plurality of circuits (systems) on one chip is referred to as system on chip (SoC) in some cases.

Figure 17A:
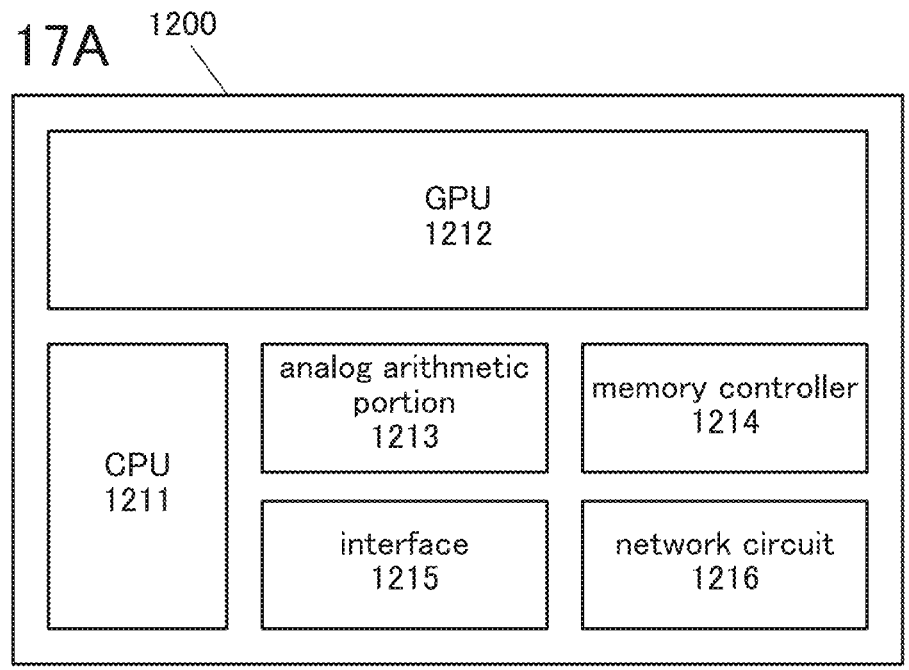
FIGS. 17A-17B A block diagram and a schematic view of a semiconductor device of one embodiment of the present invention.

As illustrated in FIG. 17(A), the chip 1200 includes a CPU (Central Processing Unit) 1211, a GPU (Graphics Processing Unit) 1212, one or more of analog arithmetic portions 1213, one or more of memory controllers 1214, one or more of interfaces 1215, one or more of network circuits 1216, and the like.

Figure 17B:
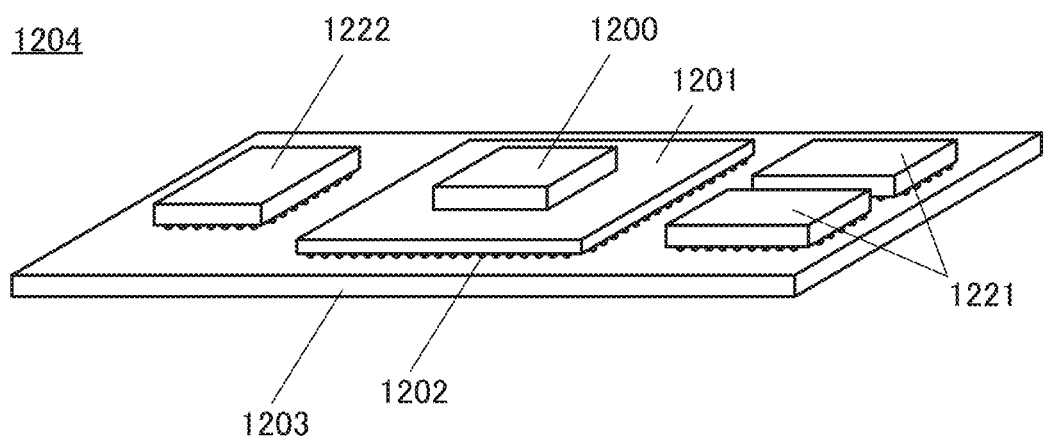

A bump (not illustrated) is provided on the chip 1200 and is connected to a first surface of a printed circuit board (PCB) 1201 as illustrated in FIG. 17(B). A plurality of bumps 1202 are provided on the rear surface of the first surface of the PCB 1201 and are connected to a motherboard 1203.

Memory devices such as a DRAM 1221 and a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. As the memory, the NOSRAM or the DOSRAM described above can be used. The GPU 1212 is suitable for parallel computation of a large number of data and thus can be used for image processing and product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

The analog arithmetic portion 1213 includes one or both of an A/D (analog/digital) converter circuit and a D/A (digital/analog) converter circuit. Furthermore, the analog arithmetic portion 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit to be connected to an external device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 in the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. The GPU module 1204 is excellent in image processing, and thus is suitably used in portable electronic devices such as a smartphone, a tablet terminal, a laptop PC, and a portable (mobile) game console. The product-sum operation circuit using the GPU 1212 can implement the arithmetic operation in a deep neural network (DNN), a convolutional neural network (CNN), a recurrent neural network (RNN), an autoencoder, a deep Boltzmann machine (DBM), a deep belief network (DBN), or the like; hence, the chip 1200 can be used as an AI chip or the GPU module 1204 can be used as an AI system module.

The structure described in this embodiment can be used in an appropriate combination with the structures described in the other embodiments.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 18 schematically illustrates some structure examples of removable memory devices. The semiconductor device described in the above embodiment is processed into a packaged memory chip and used in a variety of storage devices and removable memories, for example.

FIG. 18(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 18(B) is a schematic external view of an SD card, and FIG. 18(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 18(D) is a schematic external view of an SSD, and FIG. 18(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 6

The semiconductor device of one embodiment of the present invention can be used for a processor such as a CPU and a GPU or a chip. FIG. 19 illustrates specific examples of electronic devices including a processor such as a CPU and a GPU or a chip of one embodiment of the present invention.

<Electronic Device and System>

The GPU or the computer of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 19 illustrates examples of the electronic device.

[Mobile Phone]

FIG. 19(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

When the chip of one embodiment of the present invention is applied to the information terminal 5500, the information terminal 5500 can execute an application utilizing artificial intelligence. Examples of the application utilizing artificial intelligence include an application for recognizing a conversation and displaying the content of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal 1]

FIG. 19(B) illustrates a desktop information terminal 5300. The desktop information terminal 5300 includes a main body 5301 of the information terminal, a display 5302, and a keyboard 5303.

Like the information terminal 5500 described above, when the chip of one embodiment of the present invention is applied to the desktop information terminal 5300, the desktop information terminal 5300 can execute an application utilizing artificial intelligence. Examples of the application utilizing artificial intelligence include design-support software, text correction software, and software for automatic menu generation. Furthermore, with use of the desktop information terminal 5300, novel artificial intelligence can be developed.

Note that although the smartphone and the desktop information terminal are respectively illustrated in FIGS. 19(A) and 19(B) as examples of the electronic device, one embodiment of the present invention can be applied to an information terminal other than the smartphone and the desktop information terminal. Examples of an information terminal other than the smartphone and the desktop information terminal include a PDA (Personal Digital Assistant), a notebook information terminal, and a workstation.

[Household Appliance]

[Electrical appliance] FIG. 19(C) illustrates an electric refrigerator-freezer 5800 which is an example of an electrical appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

[Game machine] FIG. 19(D) illustrates a portable game machine 5200 which is an example of a game machine. The portable game machine includes a housing 5201, a display portion 5202, a button 5203, and the like.

When the GPU or the chip of one embodiment of the present invention is applied to the portable game machine 5200, the portable game machine 5200 with low power consumption can be achieved. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5200, the portable game machine 5200 including artificial intelligence can be achieved.

In general, the progress of a game, the actions and words of game characters, and expressions of a phenomenon and the like occurring in the game are determined by the program in the game; however, the use of artificial intelligence in the portable game machine 5200 enables expressions not limited by the game program. For example, it becomes possible to change expressions such as questions posed by the player, the progress of the game, time, and actions and words of game characters.

In addition, when a game requiring a plurality of players is played on the portable game machine 5200, the artificial intelligence can create a virtual game player; thus, the game can be played alone with the game player created by the artificial intelligence as an opponent.

Although the portable game machine is illustrated in FIG. 19(D) as an example of a game machine, the game machine using the GPU or the chip of one embodiment of the present invention is not limited thereto. Examples of the game machine to which the GPU or the chip of one embodiment of the present invention is applied include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be applied to an automobile, which is a moving vehicle, and the periphery of a driver's seat in the automobile.

FIG. 19(E1) illustrates an automobile 5700 which is an example of a moving vehicle, and FIG. 19(E2) illustrates the periphery of a windshield inside the automobile. In FIG. 19(E1), in addition to a display panel 5701, a display panel 5702, and a display panel 5703 that are attached to a dashboard, a display panel 5704 that is attached to a pillar is illustrated.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile 5700. That is, displaying an image taken by the imaging device provided outside the automobile 5700 leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Broadcasting System]

The GPU or the chip of one embodiment of the present invention can be applied to a broadcasting system.

FIG. 19(F) schematically illustrates data transmission in a broadcasting system. Specifically, FIG. 19(F) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 19(F), a BS·110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 19(F) and may be satellite broadcasting using an artificial satellite, data broadcasting using an optical line, or the like.

The broadcasting system may be a broadcasting system utilizing artificial intelligence by applying the chip of one embodiment of the present invention. When broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device included in the TV 5600. With use of artificial intelligence, for example, a display pattern included in an image to be displayed can be recognized in motion compensation prediction, which is one of the compression methods for the encoder. In addition, in-frame prediction or the like can also be performed utilizing artificial intelligence. Furthermore, for example, when broadcast data with low resolution is received and the broadcast data is displayed on the TV 5600 with high resolution, image interpolation processing such as upconversion can be performed in the broadcast data decompression by the decoder.

The broadcasting system utilizing artificial intelligence is suitable for ultra-high definition television (UHDTV: 4K, 8K) broadcasting, which needs a larger amount of broadcast data.

In addition, as an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, examples, and the like.

Example 1

In this example, the oxygen barrier property of the insulator 222 positioned over and in contact with the conductor 205 functioning as a second gate electrode of the transistor 200 was evaluated. For the evaluation, a cross-sectional observation by a scanning transmission electron microscope (STEM) and SIMS analysis were performed.

For the fabrication of samples, first, a 100-nm-thick silicon oxynitride film was deposited over a silicon wafer by a CVD method. Next, a 150-nm-thick tungsten film was deposited by a sputtering method as the conductor 205. Then, a 10-nm-thick hafnium oxide film was deposited over the tungsten film as the insulator 222 by an ALD method. Next, treatment was performed at 400° C. in a nitrogen atmosphere for one hour, and treatment was successively performed at 400° C. in an oxygen atmosphere for one hour.

As the insulator 224, a silicon oxynitride film of 30 nm was deposited by a CVD method. Next, treatment was performed at a temperature of 400° C. in a nitrogen atmosphere for one hour, and then another treatment was successively performed at a temperature of 400° C. in an oxygen atmosphere for one hour.

Next, a 60-nm-thick silicon oxynitride film was deposited by a CVD method. Next, a 40-nm-thick aluminum oxide was deposited over the silicon oxynitride film by a sputtering method. For the deposition of the aluminum oxide, an $^{18}$O which is an isotope of oxygen was used. Here, the sample was divided into four; Sample A, Sample B, Sample C, and Sample D.

Next, Sample C and Sample D were subjected to treatment performed at a temperature of 400° C. in an oxygen atmosphere for four hours. Through the above steps, Sample A, Sample B, Sample C, and Sample D were fabricated.

Figure 20A:
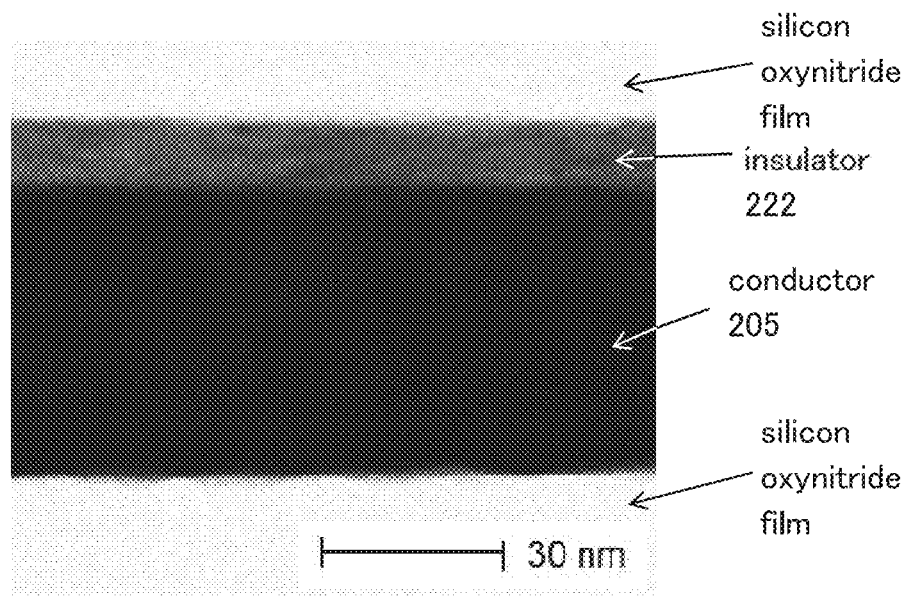
FIGS. 20A-20B Cross-sectional images of Example.
Figure 20B:
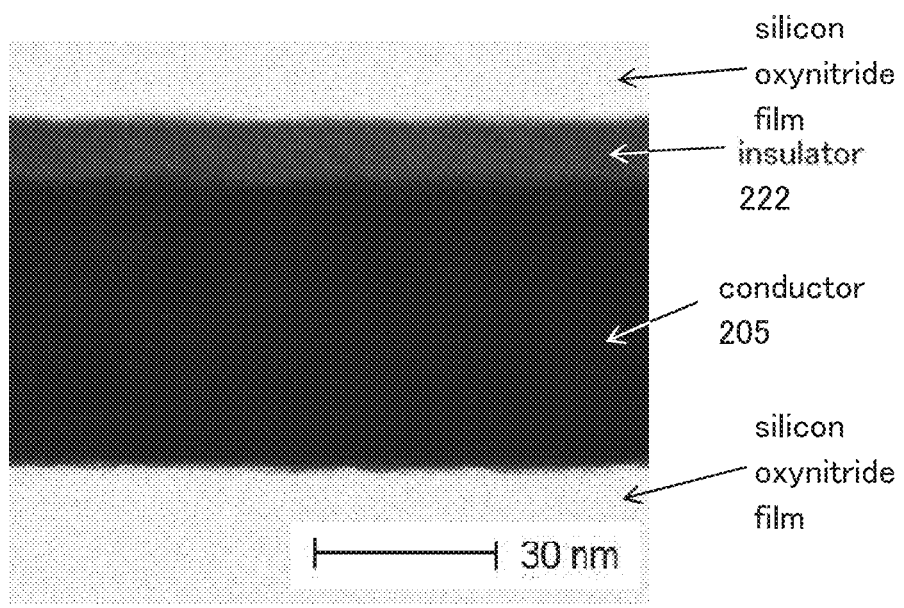

Next, a cross-sectional observation of Sample A and Sample C was performed. Cross-sectional images thereof are shown in FIG. 20. FIG. 20(A) is a cross-sectional image of Sample A which has not been subject to treatment performed at a temperature of 400° C. in an oxygen atmosphere for four hours, and FIG. 20(B) is a cross-sectional image of Sample C which has been subjected to treatment performed at a temperature of 400° C. in an oxygen atmosphere for four hours. As shown in FIGS. 20(A), and 20(B), in results of the cross-sectional observation, both in Sample A and Sample C, an abnormal layer was not observed in the vicinity of the interface between the tungsten film serving as the conductor 205 and the hafnium oxide film which is the insulator 222. From this result, it was confirmed that the oxidization of the tungsten film serving as the conductor 205 was inhibited even when the tungsten film was subjected to treatment performed at a temperature of 400° C. in an oxygen atmosphere for four hours. In other words, it was confirmed that the hafnium oxide film which is the insulator 222 has a function of suppressing oxidation of the tungsten film serving as the conductor 205 due to heat treatment.

Next, the concentration distribution of $^{18}$O in each layer of Sample B and Sample D was analyzed by SIMS analysis. Note that SIMS analysis was performed on the back surface side of each sample (the back surface side of the silicon wafer).

Figure 21A:
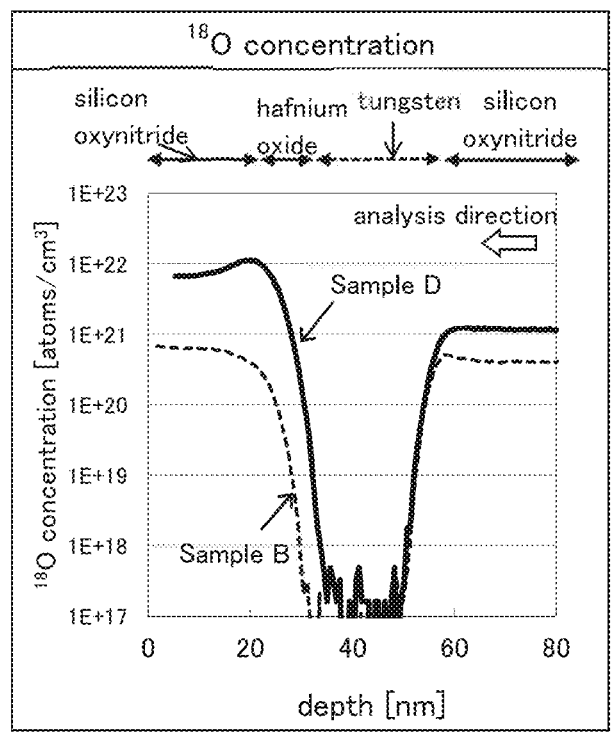
FIGS. 21A-21B Diagrams illustrating SIMS analysis results of Example.
Figure 21B:
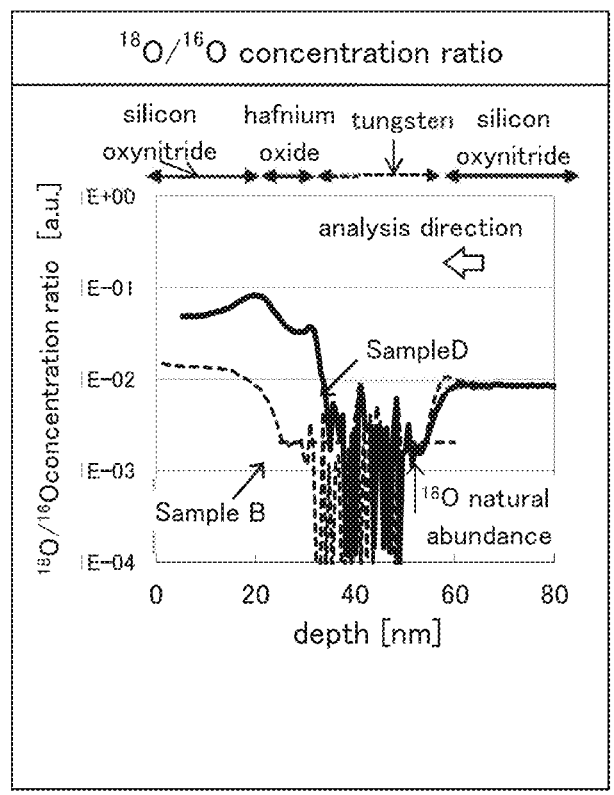

FIG. 21 shows the SIMS analysis results of Sample B and Sample D. In FIG. 21(A), the vertical axis represents the concentration of $^{18}$O (atoms/cm$^3$) and the horizontal axis represents the depth of the analysis (nm). In FIG. 21(B), the vertical axis represents the concentration ratio of $^{18}$O to $^{16}$O (a.u.) and the horizontal axis represents the depth of the analysis (nm). The quantified layer was a tungsten film.

As shown in FIGS. 21(A) and 21(B), in Sample D which was subjected to treatment performed at a temperature of 400° C. in an oxygen atmosphere for four hours, $^{18}$O diffused into the hafnium oxide film which is the insulator 222 was observed; however, it was confirmed that $^{18}$O was not diffused into the tungsten film serving as the conductor 205. That is, it was confirmed that the hafnium oxide which is the insulator 222, has an oxygen barrier property.

Example 2

In this example, the operating frequency of the DOSRAM described in Embodiment 3 was estimated. The structure of the DOSRAM was assumed to include a transistor with a design value of a channel length (L) of 30 nm and a design value of a channel width (W) of 30 nm, and a capacitor having a storage capacitance of 3.5 fF.

An "allowable voltage fluctuation", which is one of specifications required for a DOSRAM, is the allowable amount of fluctuation of a voltage applied to the capacitor of a DOSRAM after data writing. A "data retention time" of a DOSRAM can be said to be the time it takes for the fluctuation amount of a voltage applied to the capacitor included in the DOSRAM to reach the allowable voltage fluctuation. In this example, the "allowable voltage fluctuation" was 0.2 V, and the "data retention time" was the time taken for a voltage applied to the capacitor (a storage capacitance of 3.5 fF) to decrease by 0.2 V from the state after data writing. For example, in this example, the data retention time of the DOSRAM of one hour means that the time it takes for a potential applied to the capacitor included in the DOSRAM to decrease by 0.2 V after data writing is one hour.

The data retention time of the DOSRAM depends on the amount of off-state current of the DOSRAM (denoted as Ioff). For example, in the case where the data retention characteristics of the DOSRAM depend on only the amount of Ioff of the transistor included in the DOSRAM, the data retention time of the DOSRAM is inversely proportional to the amount of Ioff of the transistor included in the DOSRAM.

In the case where Ioff of the transistor included in the DOSRAM is known, the data retention time of the DOSRAM can be calculated by dividing the amount of charge lost from the capacitor during data retention (0.7 fC corresponding to the product of the capacitor's storage capacitance (3.5 fF) and the amount of decrease of the voltage applied to the capacitor (0.2 V)) by Ioff. Furthermore, when a DOSRAM retention time target is set and the above charge amount 0.7 fC is divided by the retention time, a value of Ioff required for the transistor included in the DOSRAM (hereinafter referred to as Icut0) can be estimated. When the retention time target is one hour, Ioff required for the transistor was approximately 200 zA (200× $10^{-21}$ A). By adjusting the gate voltage (denoted as Vg(off)) so that Ioff becomes 200 zA, a DOSRAM having a high operating frequency in a wide temperature range can be achieved.

To estimate the operating frequency of the DOSRAM, the transistor illustrated in FIG. 1 was fabricated, and parameters needed for the estimation were extracted from its electrical characteristics. In this example, the above transistor was assumed as the transistor M1 illustrated in FIG. 16(A), and the operating frequency of the DOSRAM was estimated.

As for the size of the fabricated transistors of Sample A and Sample B, the design value of L (channel length) was 30 nm, and the design value of W (channel width) was 30 nm. Two kinds of samples were prepared: Sample A, and Sample B.

The oxide 230a in Sample A is a 5-nm-thick In—Ga—Zn oxide. The oxide 230a was deposited by a DC sputtering method using an In—Ga—Zn oxide target with an atomic ratio of In:Ga:Zn=1:3:4. For the sputtering method, the substrate temperature was set at 200° C. and oxygen was used.

The oxide 230b is a 15-nm-thick In—Ga—Zn oxide. The oxide 530b was deposited by a DC sputtering method using an In—Ga—Zn oxide target with an atomic ratio of In:Ga:Zn=4:2:4.1. For the sputtering method, the substrate temperature was set at 200° C. and oxygen was used.

The oxide 230c had a two-layer structure. A first layer of the oxide 230c is formed using an 8-nm-thick In—Ga—Zn oxide. A second layer of the oxide 230c was deposited by a DC sputtering method using an In—Ga—Zn oxide target with an atomic ratio of In:Ga:Zn=4:2:4.1. For the sputtering method, the substrate temperature was set at 200° C. and oxygen was used. The second layer of the oxide 230c is formed using an 8-nm-thick In—Ga—Zn oxide. The second layer of the oxide 230c was deposited by a DC sputtering method using an In—Ga—Zn oxide target with an atomic ratio of In:Ga:Zn=1:3:4. For the sputtering method, the substrate temperature was set at 200° C. and oxygen was used.

The transistor of Sample A had a structure in which the conductor 205 functioning as a second gate electrode is included.

The oxide 230a of Sample B is a 20-nm-thick In—Ga—Zn oxide. The oxide 230a was deposited by a DC sputtering method using an In—Ga—Zn oxide target with an atomic ratio of In:Ga:Zn=1:3:4. For the sputtering method, the substrate temperature was set at 200° C. and a mixed gas of argon and oxygen was used.

The oxide 230b is a 15-nm-thick In—Ga—Zn oxide. The oxide 530b was deposited by a DC sputtering method using an In—Ga—Zn oxide target with an atomic ratio of In:Ga:Zn=4:2:4.1. For the sputtering method, the substrate temperature was set at 200° C. and a mixed gas of argon and oxygen was used.

The oxide 230c is a 5-nm-thick In—Ga—Zn oxide. The oxide 230c was deposited by a DC sputtering method using an In—Ga—Zn oxide target with an atomic ratio of In:Ga:Zn=1:3:2. For the sputtering method, the substrate temperature was set at 200° C. and a mixed gas of argon and oxygen was used.

The transistor of Sample B had a structure in which the conductor 205 functioning as a second gate electrode is not included.

Although, both in Sample A and Sample B, the design value of L (channel length) was set to 30 nm and the design value of W (channel width) was set to 30 nm, it was found that L=39 nm and W=25 nm in Sample A when L and W of Sample A and Sample B were measured during the process. In Sample B, L=37 nm and W=27 nm.

$I_D$-$V_G$ measurement was performed on the transistor of Sample A. The $I_D$-$V_G$ measurement was performed under conditions where a drain potential $V_D$ of the transistor was +1.08 V, a source potential $V_S$ was 0 V, and a gate potential $V_G$ was swept from −1.0 V to +3.3 V. A second gate voltage $V_{BG}$ was fixed to −3 V. Measurement temperatures were three levels of −40° C., 27° C., and 85° C.

$I_D$-$V_G$ measurement was performed on the transistor of Sample B The $I_D$-$V_G$ measurement was performed under conditions where the drain potential $V_D$ of the transistor was +1.08 V, the source potential $V_S$ was 0 V, and the gate potential $V_G$ was swept from −1.0 V to +3.3 V. Measurement temperatures were three levels of −40° C., 27° C., and 85° C.

Specifically, $I_D$-$V_G$ measurement of the transistor was performed in a state in which a 5-inch-square substrate where the transistor subjected to the measurement was formed was fixed on a thermochuck set at each of the above temperatures both for Sample A and Sample B. Three elements of each of Sample A and Sample B were measured at the set temperatures.

A shift voltage (Vsh) and a subthreshold swing value (Svalue) of the transistor were calculated from the obtained $I_D$-$V_G$ curve. The shift voltage (Vsh) is defined as, in the $I_D$-$V_G$ curve of the transistor, $V_G$ at which the tangent at a point where the slope of the curve is the steepest intersects the straight line of $I_D$=1 pA.

In the transistor, a metal oxide is used in a channel formation region as described in <Fabrication method of semiconductor device> in Embodiment 1. A transistor using a metal oxide in the channel formation region has an extremely low leakage current in an off state, compared with a transistor using Si in a channel formation region, for example. For that reason, in a transistor using a metal oxide in the channel formation region, it is sometimes difficult to detect Ioff by actual measurement. Since it was also difficult to actually measure Ioff of the transistor, Vg (off) by which Ioff becomes 200 zA was estimated from Vsh and Svalue obtained from the above $I_D$-$V_G$ curve, by extrapolation using Formula (1). In Sample A, Vg (off)=−1.59 V, and in Sample B, Vg (off)=−0.93 V. Note that as shown in Formula (1), $I_D$ was assumed to decrease monotonically according to Svalue until the off-state current of the transistor reaches $V_G$=Vg (off).

[Formula 1]

$$I_{off} = 1 \times 10^{\left(-12 - \frac{Vsh - Vg(off)}{Svalue}\right)} \quad (1)$$

Here, a method of estimating the DOSRAM operating frequency is described. The DOSRAM operating frequency is the inverse of a data write cycle of the DOSRAM. The data write cycle of the DOSRAM is a parameter set by a charging time of the capacitor included in the DOSRAM, for example. In this example, the time corresponding to 40% of the data write cycle of the DOSRAM (the inverse of the DOSRAM operating frequency) is set as the charging time of the capacitor included in the DOSRAM.

The DOSRAM operating frequency depends on the charging time of the capacitor included in the DOSRAM. Therefore, when estimating the DOSRAM operating frequency, first, it is necessary to know the charging time of the capacitor included in the DOSRAM in advance. In this example, a state where a potential of 0.52 V or higher is applied to the capacitor (a storage capacitance of 3.5 fF) included in the DOSRAM was defined as "a charged state" of the capacitor. Accordingly, in this example, the time from when DOSRAM data write operation starts until when the potential applied to the capacitor reaches 0.52 V corresponds to the charging time of the capacitor included in the DOSRAM.

Figure 22A:
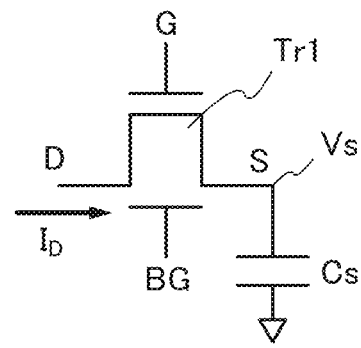
FIGS. 22A-22C Diagrams illustrating a method for calculating operating frequency.

The charging time of the capacitor included in the DOSRAM depends on the amount of $I_D$ of the transistor included in the DOSRAM at the time of DOSRAM data writing. Hence, in this example, DOSRAM data write operation was reproduced by actual application of a potential assumed to be applied to the transistor included in the DOSRAM at the time of DOSRAM data writing (see FIG. 22(A)) to the transistor (L/W=0.34/0.22 μm) according to one embodiment of the present invention, and $I_D$ of the transistor at that time was measured. In FIG. 22(A), the case where data is written to a capacitor Cs through a transistor Tr1 is assumed. D, G, and S each represent a drain, a gate, and a source, respectively. The potential of the source of the transistor Tr1 (a voltage applied to the capacitor Cs) is represented by $V_S$. By turning on the transistor Tr1, the current $I_D$ flows and the capacitor Cs is charged. For Sample A, the gate potential Vg (on) at which the transistor is turned on was set to Vg (off)+2.97 V. That is, the $I_d$ measurement of the transistor was performed under conditions where the gate potential Vg(on) was set to −1.59 V+2.97 V=+1.38 V, the drain potential Vd was set to +1.08 V, and the source potential Vs was swept from 0 V to +0.52 V. The back gate voltage $V_{BG}$ was fixed to −3 V. Measurement temperatures were three levels of −40° C., 27° C., and 85° C. For Sample B, Vg(off)=−0.93 V was satisfied; therefore, the gate potential Vg(on) was set to −0.93 V+2.97 V=+2.04 V, and the $I_D$ measurement of the transistor was performed by setting the drain potential Vd to +1.08 V, and swiping the source potential Vs from 0 V to +0.52 V. Measurement temperatures were three levels of −40° C., 27° C., and 85° C.

Figure 22B:
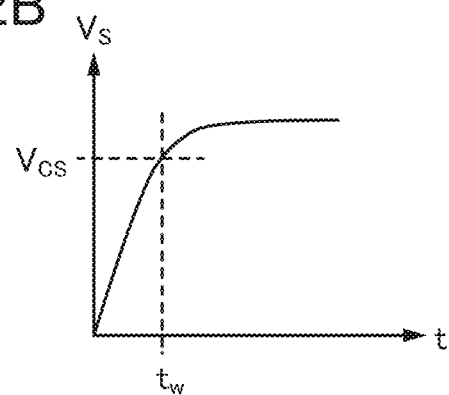

Charging is regarded as being complete when Vs reaches a write judgement voltage $V_{CS}$ after DOSRAM charging is started. The time in that moment is denoted as a charging time $t_W$ (see FIG. 22(B)). When a charge stored in a capacitor that is included in the DOSRAM and has a storage capacitance Cs [F] is Q [C], the charging time is $t_W$ [sec], a potential applied to the capacitor by charging is Vcs (=Vs) [V], and the drain current of the transistor included in the DOSRAM is $I_D$ [A], the relation of Formula (2) shown below is established between the parameters.

[Formula 2]

$$Q = \int_0^{t_w} I_D dt = C_S \times V_{cs} \quad (2)$$

Figure 22C:
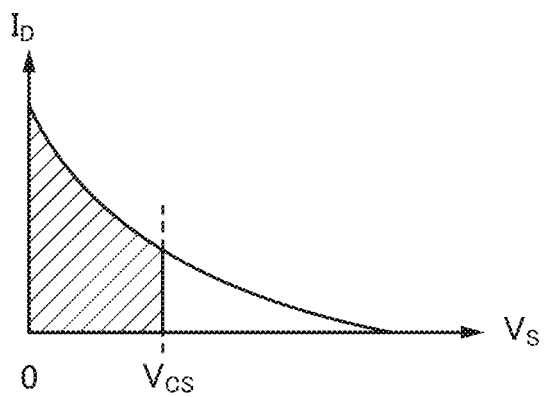

By modification of Formula (2), the charging time $t_W$ of the capacitor included in the DOSRAM can be represented by Formula (3) shown below (see FIG. 22(C)).

[Formula 3]

$$t_W = \int_0^{V_{CS}} \frac{C_S}{I_D} dV_S \quad (3)$$

In this example, 3.5 fF was substituted for Cs in Formula (3), +0.52 V was substituted for Vcs, and $I_D$ obtained from the above $I_D$-$V_S$ measurement was substituted, whereby the charging time $t_W$ of the capacitor included in the DOSRAM was calculated.

The relation between an operating frequency f of the DOSRAM and the charging time $t_W$ can be represented by Formula (4).

[Formula 4]

$$f = \frac{A}{t_W} \quad (4)$$

In Formula (4), A is a coefficient. In the DOSRAM, the time required for writing within the time of one operation is assumed to be 40%; hence, in this example, in the case where $t_W$ exceeds 2.0 nsec, coefficient A is fixed at 0.4. When $t_W$ is less than or equal to 2.0 nsec, the influence of signal delay in a peripheral circuit of a memory cannot be ignored; hence, the coefficient A needs to be set in consideration of the influence. The calculation results in consideration of the influence of signal delay in a peripheral circuit of a memory are shown in Table 1. It was assumed that the peripheral circuit operates at a clock of 2.5 GHz.

TABLE 1

| charge time($t_w$) [nsec] | write time (coefficient A) | operating frequency [MHz] |
| --- | --- | --- |
| 2.0 | 0.42 | 208 |
| 1.6 | 0.36 | 227 |
| 1.2 | 0.30 | 250 |
| 0.8 | 0.25 | 312 |
| 0.4 | 0.14 | 357 |

Figure 23A:
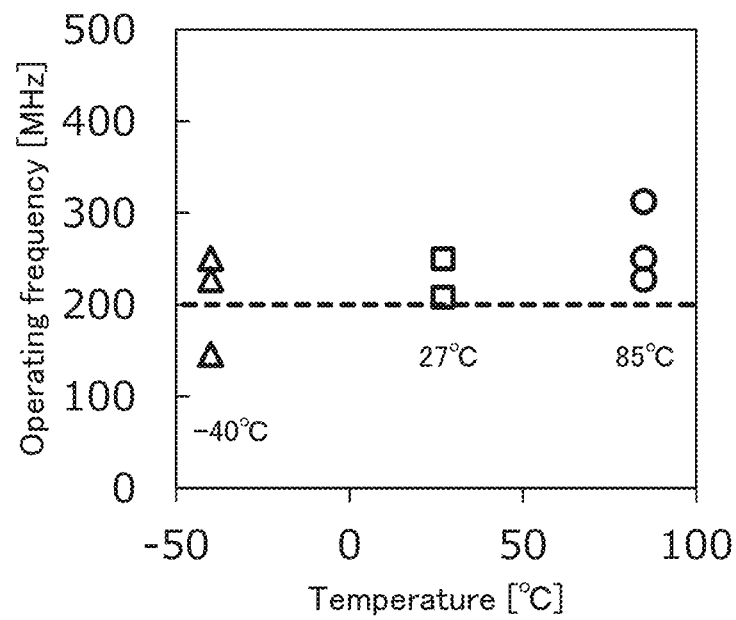
FIGS. 23A-23B Diagrams illustrating calculation results of operating frequency.
Figure 23B:
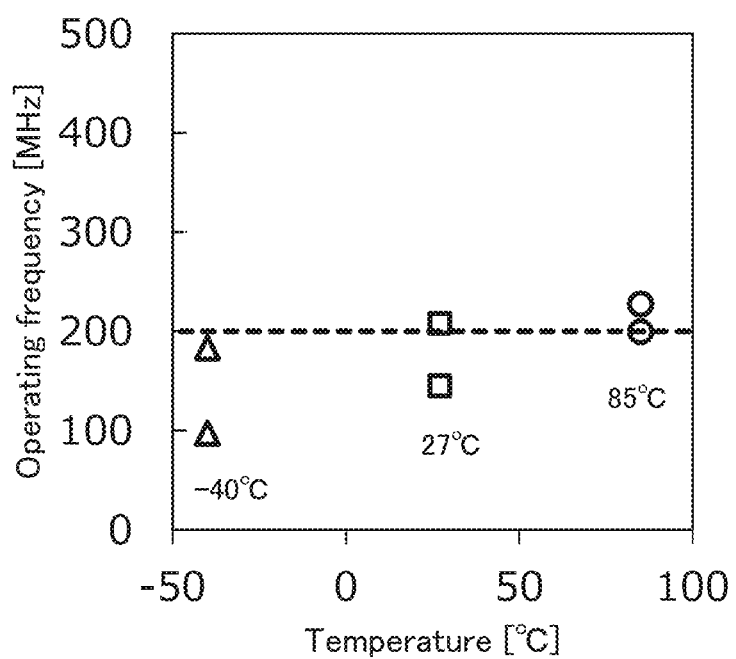

Through the above method, Sample A and Sample B were measured and the operating frequency thereof was calculated. FIG. 23(A) is a graph showing the temperature dependence of the operating frequency of Sample A, and FIG. 23(B) is a graph showing the temperature dependence of the operating frequency of Sample B. Both in Sample A and Sample B, temperature dependence of the operating frequency was observed and the higher the temperature is, the higher the operating frequency tends to be. Sample A has a higher operating frequency than Sample B overall, and in Sample A an operating frequency of 200 MHz or higher was obtained at 27° C. and 85° C.

Figure 24A:
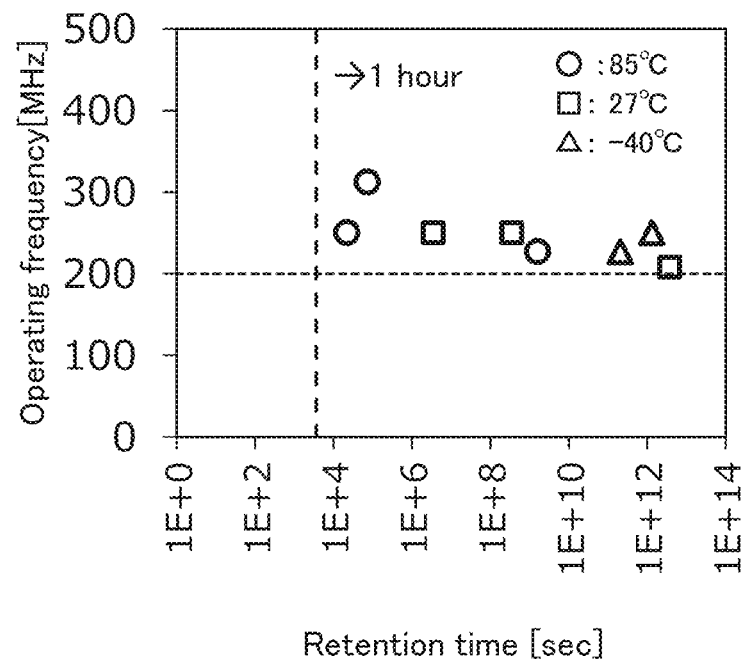
FIGS. 24A-24B Diagrams illustrating calculation results of operating frequency.
Figure 24B:
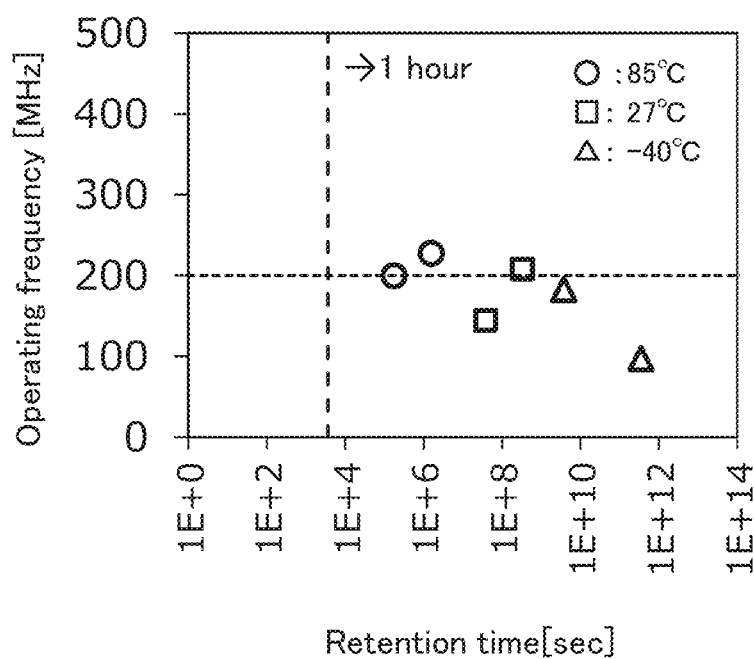

In FIG. 24, the horizontal axis represents the data retention time of the DOSRAM, and the vertical axis represents the operating frequency of the DOSRAM. FIG. 24(A) shows Sample A and FIG. 24(B) shows Sample B. As shown in FIG. 24(A), as for Sample A, an operating frequency of 200 MHz or higher and a retention time of 1 hour or more were obtained except for the 1 point at −40° C. (for this 1 point, an operating frequency of 145.7 MHz and a retention time of $1.97 \times 10^{18}$ sec were obtained; however, this 1 point was outside of the display range of FIG. 24(A)). As for Sample B, a retention time of 1 hour or more was obtained at each temperature; however, the operating frequency thereof was lower than that of Sample A.

At least part of the structure, the method, and the like described in this example can be implemented in appropriate combination with other embodiments described in this specification.

REFERENCE NUMERALS 100 capacitor, 110 conductor, 112 conductor, 120 conductor, 130 insulator, 150 insulator, 200 transistor, 203 conductor, 203a oxide, 205 conductor, 205a conductor, 205b conductor, 210 insulator, 212 insulator, 214 insulator, 215 insulator, 216 insulator, 218 conductor, 220 insulator, 222 insulator, 224 insulator, 230 oxide, 230a oxide, 230A oxide film, 230b oxide, 230B oxide film, 230c oxide, 230C oxide film, 232B oxide film, 234 region, 240 conductor, 240a conductor, 240b conductor, 241 insulator, 241a insulator, 241b insulator, 242 conductor, 242a conductor, 242A conductive film, 242b conductor, 242B conductor layer, 246 conductor, 246a conductor, 246b conductor, 250 insulator, 250A insulating film, 260 conductor, 260a conductor, 260Aa conductive film, 260Ab conductive film, 260b conductor, 272 insulator, 272A insulating film, 273 insulator, 273A insulating film, 274 insulator, 276 insulator, 280 insulator, 281 insulator, 282 insulator, 300 transistor, 311 substrate, 313 semiconductor region, 314a low-resistance region, 314b low-resistance region, 315 insulator, 316 conductor, 320 insulator, 322 insulator, 324 insulator, 326 insulator, 328 conductor, 330 conductor, 350 insulator, 352 insulator, 354 insulator, 356 conductor, 400 transistor, 405 conductor, 430c oxide, 431a oxide, 431b oxide, 432a oxide, 432b oxide, 440 conductor, 440a conductor, 440b conductor, 442 conductor, 442a conductor, 442b conductor, 450 insulator, 460 conductor, 460a conductor, 460b conductor, 530b oxide, 1001 wiring, 1002 wiring, 1003 wiring, 1004 wiring, 1005 wiring, 1006 wiring, 1007 wiring, 1008 wiring, 1009 wiring, 1010 wiring, 1100 USB memory, 1101 housing, 1102 cap, 1103 USB connector, 1104 substrate, 1105 memory chip, 1106 controller chip, 1110 SD card, 1111 housing, 1112 connector, 1113 substrate, 1114 memory chip, 1115 controller chip, 1150 SSD, 1151 housing, 1152 connector, 1153 substrate, 1154 memory chip, 1155 memory chip, 1156 controller chip, 1200 chip, 1201 PCB, 1202 bump, 1203 motherboard, 1204 GPU module, 1211 CPU, 1212 GPU, 1213 analog arithmetic portion, 1214 memory controller, 1215 interface, 1216 network circuit, 1221 DRAM, 1222 flash memory, 1400 memory device, 1411 peripheral circuit, 1420 row circuit, 1430 column circuit, 1440 output circuit, 1460 control logic circuit, 1470 memory cell array, 1471 memory cell, 1472 memory cell, 1473 memory cell, 1474 memory cell, 1475 memory cell, 1476 memory cell, 1477 memory cell, 1478 memory cell, 2274 insulator, 5200 portable game machine, 5201 housing, 5202 display portion, 5203 button, 5300 desktop information terminal, 5301 main body, 5302 display, 5303 keyboard, 5500 information terminal, 5510 housing, 5511 display portion, 5600 TV, 5650 antenna, 5670 radio wave tower, 5675A wave, 5675B wave, 5680 broadcasting station, 5700 automobile, 5701 display panel, 5702 display panel, 5703 display panel, 5704 display panel, 5800 electric refrigerator-freezer, 5801 housing, 5802 refrigerator door, 5803 refrigerator door

The invention claimed is:

1. A semiconductor device comprising:
   a first insulator;
   a first oxide over the first insulator;
   a second oxide over the first oxide;
   a first conductor and a second conductor over the second oxide;
   a third oxide over the second oxide;
   a second insulator over the third oxide;
   a third conductor located over the second insulator and overlapping with the third oxide;
   a third insulator in contact with a top surface of the first insulator, a side surface of the first oxide, a side surface of the second oxide, a side surface of the first conductor, a top surface of the first conductor, a side surface of the second conductor, and a top surface of the second conductor;
   a fourth insulator over the third insulator;
   a fifth insulator over the fourth insulator; and
   a sixth insulator over the third conductor, the second insulator, the third oxide and the fifth insulator,
   wherein the sixth insulator is in contact with a top surface of each of the third conductor, the second insulator, the third oxide, and the fifth insulator.

2. The semiconductor device according to claim 1,
   wherein the third insulator and the fourth insulator are each less likely to transmit one or both of oxygen and hydrogen than the first insulator.

3. The semiconductor device according to claim 1,
   wherein the third insulator, the fourth insulator, and the sixth insulator are each less likely to transmit one or both of oxygen and hydrogen than the second insulator.

4. The semiconductor device according to claim 1,
   wherein the fourth insulator and the sixth insulator are each an oxide comprising one or both of aluminum and hafnium.

5. The semiconductor device according to claim 1,
   wherein the fourth insulator and the sixth insulator are each aluminum oxide.

6. The semiconductor device according to claim 1,
   wherein the third insulator comprises silicon and nitrogen.

7. The semiconductor device according to claim 1,
   wherein the first oxide to the third oxide comprise In, an element M (M is Al, Ga, Y, or Sn), and Zn.

\* \* \* \* \*